United States Patent [19]
Johnson et al.

[11] Patent Number: 5,994,639
[45] Date of Patent: Nov. 30, 1999

[54] THERMODYNAMICALLY METASTABLE SKUTTERUDITE CRYSTALLINE-STRUCTURED COMPOUNDS

[75] Inventors: David C. Johnson, Eugene; Marc Hornbostel, Cresswell, both of Oreg.

[73] Assignee: The State of Oregon Acting by and Through the State Board of Higher Education on Behalf of the University of Oregon, Eugene, Oreg.

[21] Appl. No.: 08/824,254

[22] Filed: Mar. 25, 1997

[51] Int. Cl.$^6$ .................................................. H01L 35/12
[52] U.S. Cl. .................. 136/236.1; 136/238; 136/240; 252/62.3 T; 257/15; 257/22; 257/930
[58] Field of Search .............................. 136/236.1, 238, 136/239, 240; 257/15, 22, 467, 468, 469, 470, 613, 616, 930; 252/62.3 T

[56] References Cited

U.S. PATENT DOCUMENTS

| | | |
|---|---|---|
| 3,454,370 | 7/1969 | Castellion . |
| 3,932,291 | 1/1976 | Donohue .......................... 252/62.3 V |
| 4,447,277 | 5/1984 | Jayadev et al. ......................... 148/400 |
| 4,994,867 | 2/1991 | Biegelsen . |
| 5,198,043 | 3/1993 | Johnson . |
| 5,436,467 | 7/1995 | Elsner et al. . |
| 5,610,366 | 3/1997 | Fleurial et al. . |
| 5,726,381 | 3/1998 | Horio et al. ......................... 136/236.1 |

OTHER PUBLICATIONS

Braun et al., Thorium Containing Pnictides with the LaFe4P12 Structure, Journal of Less Common Metals, vol. 76, pp. 33–40, 1980.

Noh, Myungkeun, et al., "Crystalline Superlattices with Designed Structure from Elementally Modulated Reactants," *Advanced Materials*, ISSN 0935–9648, vol. 8, No. 7, Jul. 1996, pp. 596–599.

(List continued on next page.)

*Primary Examiner*—Kathryn Gorgos
*Assistant Examiner*—Wesley A. Nicolas
*Attorney, Agent, or Firm*—Klarquist Sparkman Campbell Leigh & Whinston LLP

[57] ABSTRACT

Thermodynamically metastable skutterudite crystalline-structured compounds are disclosed having preselected stoichiometric compositions and superior and optimizable thermoelectric properties. The compounds are formed at low nucleation temperatures and satisfy the formula:

$$M_{1-x}M'_{4-y}Co_yM''_{12}$$

wherein:

M=any metal, metalloid, or mixture thereof, except for La, Ce, Pr, Nd, and Eu when x=0, and M'=Fe, Ru, or Os, and M''=Sb, P, or As;

M'=Fe, Ru, Os, Rh, or mixture thereof;

M''Sb, As, P, Bi, $Ge_{0.5-w}Se_{0.5+w}$, wherein w=0 to 0.5 or mixture thereof;

x=0 to 1;

y=0 to 4; and wherein M' and/or M'' are doped or undoped. These compounds generally have the crystalline structure of a skutterudite, wherein the crystalline structure is cubic with 34 atoms in the unit-cell in the space group Im$\bar{3}$. The M''$_{12}$ atoms occupy unit-cell sites 24(g), the M'$_{4-y}$ atoms form a cubic sublattice occupying unit-cell sites 8(c), and the $M_{1-x}$ atoms are positioned in two remaining "holes" or interstitial sites in the unit-cell, namely sites 2(a). These thermodynamically metastable skutterudite crystalline-structured compounds possess relatively low thermal conductivity properties with relatively high electrical conductivity properties, making the compounds ideal for use in thermoelectric devices.

35 Claims, 12 Drawing Sheets

OTHER PUBLICATIONS

Noh, Myungkeun, et al., "Synthesis of Crystalline Superlattices by Controlled Crystallization of Modulated Reactants," *Science*, vol. 270, Nov. 17, 1995, pp. 1181–1184.

Noh, Myungkeun, and Johnson, David C., "Designed Synthesis of Solid State Structural Isomers from Modulated Reactants," *Journal of the American Chemical Society*, vol. 118, No. 38, 1996, pp. 9117–9122 No month available.

Sales, B. C., et al., "Filled Skutterudite Antimonides: A New Class of Thermoelectric Materials," *Science*, vol. 272, May 31, 1996, pp. 1325–1328.

Moss, Susan, et al., "Synthesis of Designed W–WSe$_2$ Heterostructures from Superlattice Reactants," *Chem. Mater.*, vol. 8, No. 8, 1996, pp. 1853–1857 No month available.

Fister, Loreli, and Johnson, David C., "Controlling Solid–State Reaction Mechanisms Using Diffusion Length in Ultrathin–Film Superlattice Composites," *Journal of the American Chemical Society*, vol. 114, No. 12, 1992, pp. 4639–4644 No month available.

Fister, Loreli, et al., "Deposition System for the Synthesis of Modulated, Ultrathin–film Composites," *J. Vac. Sci. Technol. A*, vol. 11, No. 6, Nov./Dec. 1993, pp. 3014–3019.

Fister, Loreli, et al., "Synthesis of $Cu_xMo_6Se_8$ without Binary Compounds as Intermediates: A Study Using Superlattices to Kinetically Control a Solid–State Reaction," *Journal of the American Chemical Society*, vol. 116, No. 2, Jan. 26, 1994, pp. 629–633.

Fukuto, Masafumi, et al., "Use of Superlattice Structure to Control Reaction Mechanism: Kinetics and Energetics of $Nb_5Se_4$ Formation," *Journal of the American Chemical Society*, vol. 116, No. 20, Oct. 5, 1994, pp. 9136–9140.

Oyelaran, Oyinda, et al., "Controlling Solid–State Reaction Pathways: Composition Dependence in the Nucleation Energy of InSe," *Journal of the American Chemical Society*, vol. 118, No. 10, Mar. 13, 1996, pp. 2422–2426.

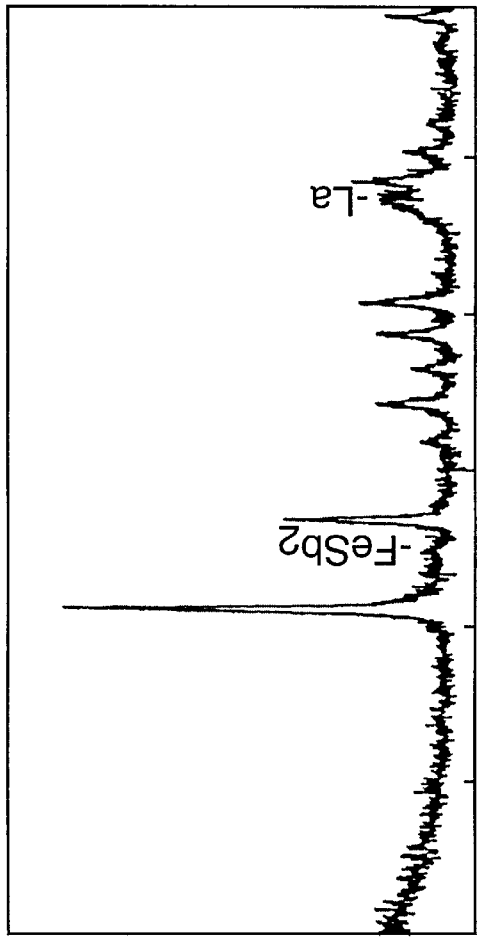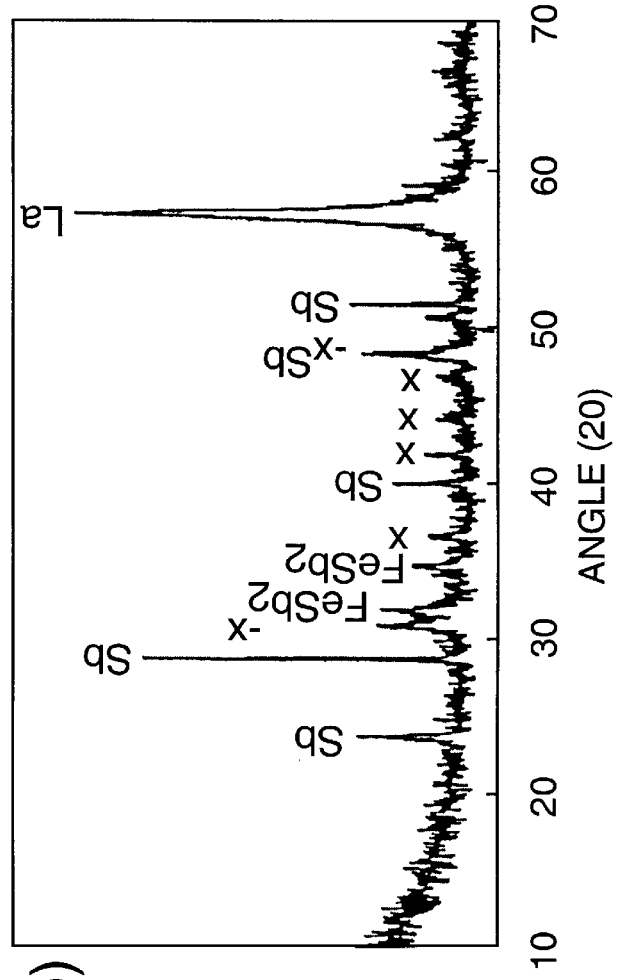

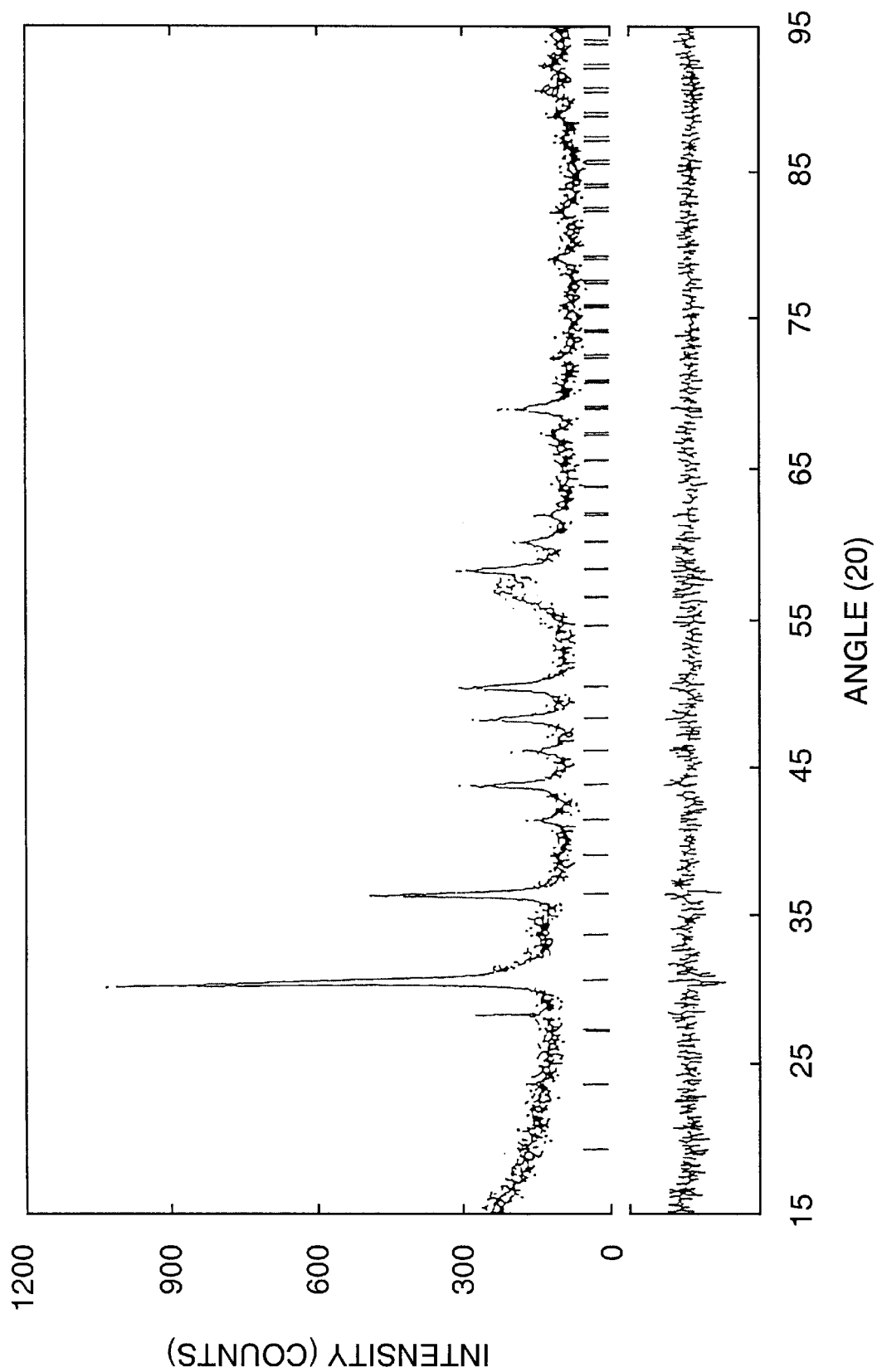

THERMODYNAMICALLY METASTABLE SKUTTERUDITE CRYSTALLINE-STRUCTURED COMPOUNDS

This invention was developed under grant No. DMR-9510562 from the National Science Foundation. Accordingly, the U.S. government has rights in this invention.

FIELD OF THE INVENTION

This invention relates to solid-state, metastable compounds having superior thermoelectric properties, and more particularly, to thermodynamically metastable compounds having a skutterudite crystalline structure.

BACKGROUND OF THE INVENTION

Many advances in both science and technology have begun with the discovery of new materials with new or unusual properties, Warren et al., *Materials Science and Engineering*, 50:149–198, 1981. Following such discoveries, new applications are developed for the materials and the material properties are optimized for these applications.

Specific structures or structural modifications of particular compounds improve desirable physical properties of the compounds and/or test observed structure-property correlations for future optimization of the compounds' properties.

Artificially structured solid-state materials, i.e., materials where the structural and chemical characteristics are planned for and controlled, lead to many advances in technology. The synthesis of artificially structured, solid-state compounds has been dominated by extended high-temperature reaction of elements or binary compounds due to the slow diffusion rates in solids, DiSalvo, *Science*, 247:649–655, 1990. Such extended high-temperature reactions lead to the thermodynamically most stable product. During these reactions, many intermediate compounds form before the system achieves the final, thermodynamically stable configuration of products. Additionally, many desirable but thermodynamically metastable solid-state compounds cannot be synthesized by such conventional methods.

There is a demand for artificially structured compounds with optimized or optimizable thermoelectric properties for various specific thermoelectric devices. Materials used today in thermoelectric devices, $Bi_2Te_3$—$Sb_2Te_3$, alloys for refrigeration and silicon, Si—Ge, alloys for power generation at elevated temperatures, were developed in the early 1960's, Sales et al., *Science*, 272:1325–1328, 1996. The main drawback of current thermoelectric materials used in devices is their efficiency. A material's efficiency depends on the material's properties, generally measured by the dimensionless parameter ZT, known as the thermoelectric Figure of Merit, where T is the temperature and $$Z = \frac{S^2}{\kappa \rho},$$

where S is the Seebeck coefficient (also known as the thermopower), $\rho$ is the electrical resistivity, and $\kappa$ is the thermal conductivity of the material.

Many materials have been studied with the hope of optimizing each material's thermopower (and hence, the ZT value), and consequently optimizing the efficiency of corresponding thermoelectric devices. Theory shows that there is no fundamental maximum to the thermoelectric Figure of Merit, Goldsmid, *Electronic Refrigeration*, Pion, London, 1986; Wood, *Rep. Prog. Phys.*, 51: 459, 1988. A thermoelectric Figure of Merit of ZT=3 would make thermoelectric refrigerators competitive with traditional compressor-based refrigerators, Sales et al., *Science*, 272:1325–1328, 1996.

Recently, a class of compounds known as "filled skutterudites" have provided some promising thermoelectric materials. The filled skutterudite compounds satisfy the formula:

$RM_4X_{12}$ where R is La, Ce, Pr, Nd, or Eu; M is Fe, Ru, or Os; and X is P, As, or Sb. The filled skutterudites are structurally related to the mineral skutterudite, $CoAs_3$, but contain the cation La, Ce, Pr, Nd, or Eu in a large, interstitial site within the crystalline structure. Jeitschko et al., *Acta Crystallographica*, B33:3401–3406, 1977. Filled skutterudite compounds having Figures of Merit as high as ZT=0.9±0.2 have been synthesized, Sales et al., *Science*, 272:1325–1328, 1996.

Filled skutterudites are promising thermoelectric materials because they have low thermal conductivity while still maintaining good electrical conductivity. The low thermal conductivity is thought to result from a large thermal vibration amplitude of the cation, which is equivalent to having a nearly soft phonon mode in the crystal lattice. The large vibration amplitude, which is a result of the interstitial site being too large for the cation, causes scattering of phonons and therefore a low phonon contribution to the thermal conductivity. Electrical conductivity, however, occurs primarily in the antimony framework, and is largely decoupled from the soft phonon mode.

Difficulties in synthesis have prevented production and measurement of the thermoelectric properties of most of the known filled skutterudite compounds, Sales et al., *Science*, 272:1325–1328, 1996. Filled skutterudites are made by conventional synthesis techniques resulting in, inter alia, mixed phase powders containing unwanted binary compounds and excess antimony, Braun et al., *Journal of the Less-Common Metals*, 72:147–156, 1980. Moreover, many desirable kinetically stable but thermodynamically unstable skutterudite crystalline-structured compounds cannot be synthesized by conventional, extended high-temperature methods. The thermodynamically metastable (unstable) skutterudite crystalline-structured compounds are desirable because of their thermoelectric properties.

Conventional synthesis of compounds having a skutterudite crystal structure have involved extended annealing of the components at high temperatures (i.e., 550° C. and higher), yielding thermodynamically stable skutterudite compounds. That is, all previously synthesized or known skutterudite compounds have been thermodynamically stable compounds that have the largest free-energy gain upon crystallization relative to other possible compounds. Thermodynamically metastable compounds, on the other hand, have a relatively higher free-energy configuration at ambient temperature (i.e., the compound is not in the configuration with the lowest possible free energy), but do not have sufficient thermal energy to transform into the equilibrium configuration of a thermodynamically stable compound. Thermodynamically metastable compounds cannot be formed at temperatures greater than about 400° C.–500° C. Above about 400° C.–500° C. any formed thermodynamically metastable skutterudite crystalline-structured compounds decompose exothermically, forming the thermodynamically stable mixture of binary compounds and elemental components.

SUMMARY OF THE INVENTION

In general, the present invention provides novel filled, partially-filled, and unfilled thermodynamically metastable compounds with skutterudite crystalline structures that have superior and optimizable thermoelectric properties. Since such compounds are thermodynamically metastable, however, they have heretofore not been synthesized. The compounds have preselected stoichiometric compositions. Specifically, the metastable compounds of the present invention have been designed to optimize the thermoelectric properties of compounds possessing a skutterudite crystalline structure, and verify the proposed correlation between the soft phonon mode of the crystal's interstitial site and the low thermal conductivity.

The thermodynamically metastable skutterudite crystalline-structured compounds of the present invention satisfy the formula:

$$M_{1-x}M'_{4-y}Co_yM''_{12}$$

wherein:
M=any metal, metalloid, or mixture thereof;
M'=Fe, Ru, Os, Rh, or mixture thereof, wherein M' is doped or undoped;
M''=Sb, As, P, Bi, $Ge_{0.5-w}Se_{0.5+w}$ wherein w=0 to 0.5, or mixture thereof, wherein M'' is doped or undoped;
x=0 to 1; and
y=0 to 4.

However, when x=0, M cannot comprise La, Ce, Pr, Nd or Eu, if, at the same time, M'=Fe, Ru, or Os and M''=Sb, P, or As. Put another way, the thermodynamically metastable skutterudite crystalline-structured compounds of the present invention do not include the thermodynamically stable filled skutterudite compounds that satisfy the formula:

$$RM_4X_{12}$$

where R is La, Ce, Pr, Nd or Eu; M is Fe, Ru, or Os; and X is P, As, or Sb. Accordingly, when there is full occupancy (i.e., x=0) of M atom (the metal or metalloid) and M'=Fe, Ru or Os and M''=Sb, P, or As, the compound is not a thermodynamically metastable compound of the present invention.

In the compounds of the present invention, M'' may be Sb, As, P, Bi, Co, ($Ge_{0.5-w}Se_{0.5+w}$ wherein w=0 to 0.5, or mixtures thereof. The germanium and selenium are grouped together as the compound should be isoelectronic.

One group of the thermodynamically metastable compounds of the present invention includes a cation in the interstitial site wherein the cation has a relatively small ionic radius and a relatively high mass to further optimize the thermoelectric properties of the material. According to the present invention, cations having relatively small ionic radii with relatively large masses have been "substituted" into the interstitial sites of the skutterudite crystals forming thermodynamically metastable compounds.

In another group of thermodynamically metastable compounds of the present invention, the cation occupancy is varied to provide partial occupancy of the interstitial site of the skutterudite crystal to optimize the thermoelectric properties of the crystal. Metastable compositions of the present invention also comprise skutterudite crystalline-structured compounds optimizing the thermoelectric properties through introduction of vacancies in the crystal lattice structure.

In another group of thermodynamically metastable compounds of the present invention, the thermodynamically metastable compound forms a superlattice crystalline structure satisfying the formula:

$$[M_{1-x}M'_{4-y}Co_yM''_{12}]_m[N_{1-x}N'_{4-y}Co_yN''_{12}]_n$$

wherein:
M=any metal, metalloid, or mixture thereof;
M'=Fe, Ru, Os, Rh, or mixture thereof, wherein M' is doped or undoped;
M''=Sb, As, P, Bi, $Ge_{0.5-w}Se_{0.5+w}$ wherein w=0 to 0.5, or mixture thereof, wherein M'' is doped or undoped;
x=0 to 1;
y=0 to 4;
N=any metal, metalloid, or mixture thereof;
N'=Fe, Ru, Os, Rh, or mixture thereof, wherein N' is doped or undoped;
N''=Sb, As, P, Bi, $Ge_{0.5-w}Se_{0.5+w}$ wherein w=0 to 0.5, or mixture thereof, wherein N'' is doped or undoped; and
n and m represent a quantity greater than zero and are, typically, integers.

In another group of the thermodynamically metastable compounds of the present invention, the thermodynamically metastable compounds form a superlattice crystalline structure satisfying the formula:

$$[M_{1-x}M'_{4-y}Co_yM''_{12}]_m[N_aN'_bN''_c]_n$$

wherein:
M=any metal, metalloid, or mixture thereof;
M'=Fe, Ru, Os, Rh, or mixture thereof, wherein M' is doped or undoped;
M''=Sb, As, P, Bi, $Ge_{0.5-w}Se_{0.5+w}$ wherein w=0 to 0.5, or mixture thereof, wherein M'' is doped or undoped;
x=0 to 1;
y=0 to 4;
N=Ga, Al, Zn, Cd, Cu, or mixture thereof;
N'=Si, Ge, Sn, In, or mixture thereof;
N''=As, S, P, Se, N, C, or mixture thereof;
a=1 or 2;
b=0 or 1;
c=1, 2, or 3;
n and m represent a quantity greater than 0 and, typically, are integers; or N, N', and N'' may, together, be any ternary sulfide with a chalcopyrite structure or any ternary selenide with a chalcopyrite structure.

Such thermodynamically metastable skutterudite crystal-structured superlattice compounds of the present invention have relatively high Seebeck coefficients, providing material possessing superior Figures of Merit. Moreover, because the materials have a superlattice structure comprising at least two different thermodynamically metastable skutterudite crystal structures in a single structure, the available variables for optimizing the thermoelectric properties of the superlattice materials are multiplied.

The thermodynamically metastable compounds of the present invention not only provide materials with optimizable thermoelectric properties, but also may provide materials possessing the highest Figure of Merit (ZT value) of any known thermoelectric material.

BRIEF DESCRIPTION OF THE DRAWINGS

FIG. 3a is an X-ray Diffraction Scan performed on a $La_{0.81}Fe_{4.17}Sb_{12}$ sample after heating to 250° C. (Example I).

FIG. 3b is an X-ray Diffraction Scan performed on a mixture of La, Sb, $FeSb_2$, and a minor component of $LaFe_4Sb_{12}$, indicated by diffraction maxima marked with Xs (Example I).

FIG. 5 shows the results of Reitveld Refinement performed on a sample comprising $La_{0.81}Fe_{4.17}Sb_{12}$ (Example I).

DETAILED DESCRIPTION

Thermodynamically Stable Skutterudite Crystalline Compounds

A "skutterudite" is a crystalline mineral composed of cobalt and nickel arsenides. A "crystal" is an orderly array of particles. A "space group" defines the basic lattice structure of a three-dimensional crystal. The crystal structure is obtained by associating with each point in the lattice an assembly of asymmetric unit cells. The unit cell is the fundamental unit from which the entire crystal may be constructed by purely translational displacements.

A "filled skutterudite" structure is a compound satisfying Formula (1):

$$RM_4X_{12} \quad (1)$$

wherein R=La, Ce, Pr, Nd, or Eu;
M=Fe, Ru, or Os; and
X=P, As, or Sb.

The filled skutterudite structures are cubic crystals with 34 atoms in the unit cell. The La, Ce, Pr, Nd, or Eu are positioned in the interstitial site 2(a) of the unit cell with the Fe, Ru, or Os forming a simple cubic sublattice and the Sb, As, or P forming square, planar rings.

The filled skutterudite compounds are both kinetically and thermodynamically stable having full occupancy of all atomic sites in the crystal.

Thermodynamically Metastable Skutterudite Crystalline-Structured Compounds

The thermodynamically metastable skutterudite crystalline-structured compounds of the present invention, generally satisfy Formula (2):

$$M_{1-x}M'_{4-y}Co_yM''_{12} \quad (2)$$

wherein:
M=any metal, metalloid, or mixture thereof, except La, Ce, Pr, Nd, and Eu whenever x=0, and M'=Fe, Ru, or Os, and M''=Sb, P, or As;
M'=Fe, Ru, Os, Rh, or mixture thereof, wherein M' is doped or undoped;
M''=Sb, As, P, Bi, $Ge_{0.5-w}Se_{0.5+w}$ wherein w=0 to 0.5, or mixture thereof, wherein M'' is doped or undoped;
x=0 to 1; and
y=0 to 4.

A "metal" is an element that forms positive ions in solutions, and produces oxides that form hydroxides rather than acids upon reaction with water. Metals include, without limitation, alkaline metals, alkali-earth metals, transition metals, noble metals (including the precious metals gold, silver, and platinum), rare-earth metals (lanthanides), actinides (including transuranic metals), light metals, heavy metals, and radioactive metals. A "light metal" is a metal or alloy of low density, especially aluminum and magnesium alloys. A "heavy metal" is a metal whose specific gravity is approximately 5.0 or higher. A "radioactive metal" is a luminous metallic element, such as actinium, radium, or uranium, that spontaneously and continuously emits radiation capable, in some degree, of penetrating matter impervious to ordinary light. "Metalloids" are elements with both metallic and non-metallic properties, and include without limitation, arsenic, boron, silicon, germanium, antimony, polonium, selenium, and tellurium. As used herein, M' and/or M'' are "doped" when an impurity is added to M' and/or M'' to produce compounds having desired electrical states and corresponding characteristics.

Figure 1:
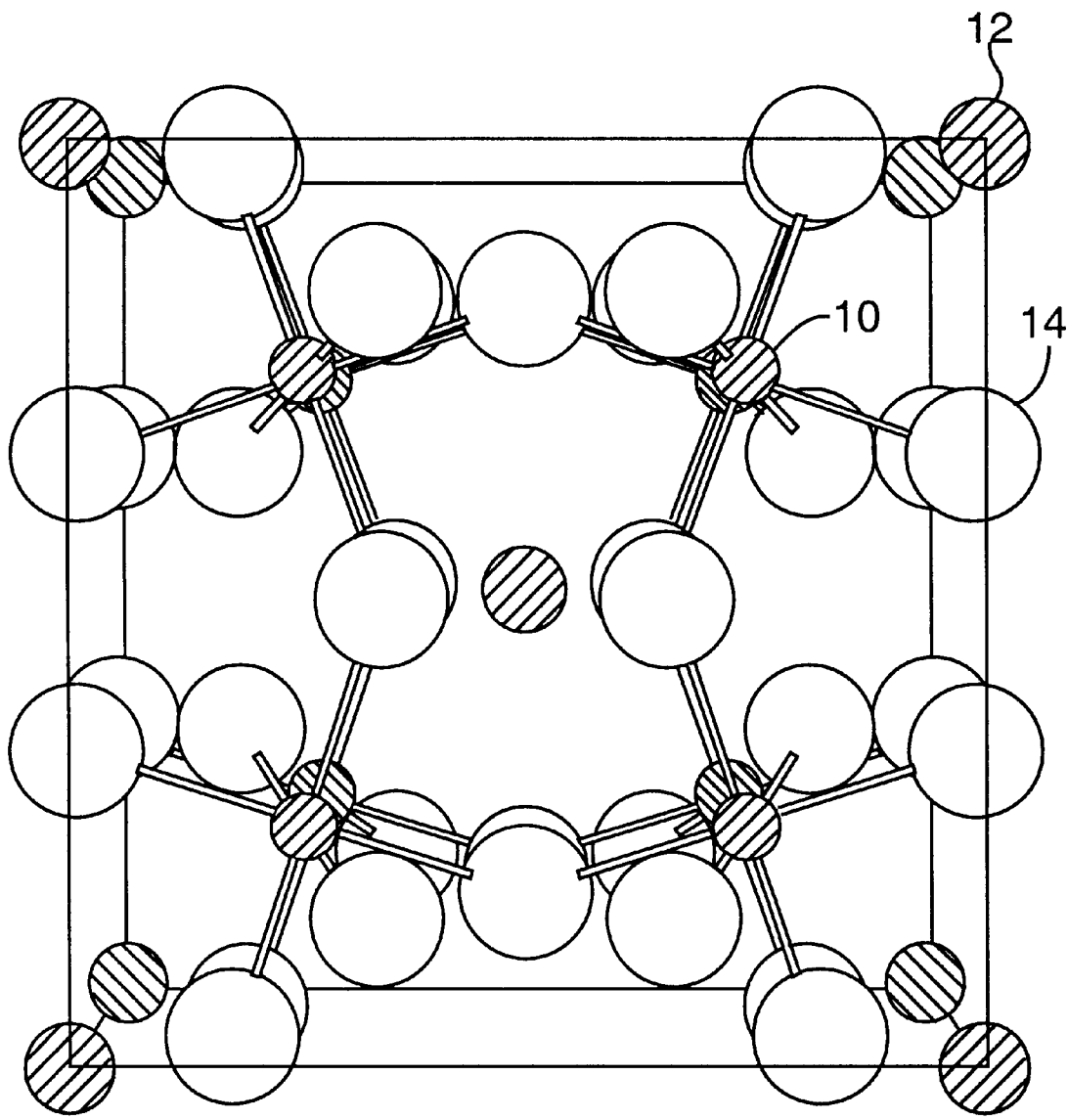
FIG. 1 shows the basic crystalline structure of a compound of the present invention.

The thermodynamically metastable skutterudite crystalline-structured compounds of the present invention generally have the same basic crystalline structure of a skutterudite. Referencing the International Table for Crystallography, the crystalline structure of the compounds of the present invention is generally cubic with 34 atoms in the unit cell in the space group $Im\bar{3}$. The $M''_{12}$ atom(s) (or "framework" atoms) occupy unit cell sites 24(g). The $M'_{4-y}$ atoms form a cubic sublattice occupying unit cell sites 8(c), and the $M_{1-x}$ (generally cations) are positioned in two remaining "holes" or interstitial sites in the unit cell, sites 2(a). FIG. 1 shows the crystalline structure of a compound of the present invention wherein the $M_{1-x}$ atoms are in unit-cell sites 2(a) and are designated 10, the $M'_{4-y}$ atoms are in unit-cell sites 24(g) and are designated 12, and the M"$_{12}$ atoms are in unit-cell sites 8(c) and are designated 14.

Thermoelectric Properties of Thermodynamically Metastable Skutterudite Crystalline-Structured Compounds The efficiency of a thermoelectric device or material is generally evaluated by the Figure of Merit of the device or material. The Figure of Merit is a dimensionless parameter ZT, wherein T is the temperature and $$Z = \frac{S^2}{\kappa\rho},$$

wherein S is the Seebeck coefficient (the thermopower), $\rho$ is the electrical resistivity, and $\kappa$ is the thermal conductivity of the material or device. The "Seebeck coefficient" (or "thermopower") is a measure of the temperature-induced voltage in a conductor and is equal to the ratio of the open-circuit voltage to the temperature difference between the hot and cold junctions of a circuit exhibiting a Seebeck effect. The "Seebeck effect" is the development of a voltage due to differences in temperature between two junctions of dissimilar metals in the same circuit. "Thermal conductivity" means the heat flow across a surface per unit area per unit time, divided by the negative of the rate of change of temperature with distance in a direction perpendicular to the surface. The "electrical resistivity" is the electrical resistance of a material, times the cross-sectional area of current flow and per unit length of current path.

Skutterudite crystalline-structured materials are considered promising thermoelectric materials because they possess relatively low thermal conductivity and relatively high electrical conductivity. The "thermoelectricity" of a material is the ability of the material to directly convert heat into electrical energy, or the reverse. The "electrical conductivity" is the ratio of the electric current density to the electric field in a material.

The low thermal conductivity of skutterudite crystalline-structured compounds is thought to result from the large thermo-vibration amplitude of the $M_{1-x}$ atom, which is equivalent to having a soft phonon mode in the crystalline lattice. This large vibration amplitude, which is a result of the interstitial site being too large for the $M_{1-x}$ atom, causes scattering of phonons and results in a low phonon contribution to the thermal conductivity. The electrical conductivity, however, occurs primarily in M"$_{12}$ atomic framework of the crystalline compound. Accordingly, the electrical conductivity is largely decoupled from the soft phonon mode of the $M_{1-x}$ atom, resulting in a material with low thermal conductivity, yet high electrical conductivity.

The compounds of the present invention have the skutterudite crystal structure but further improve the thermoelectric properties of such crystalline materials by providing particular thermodynamically metastable compounds that optimize thermoelectric properties related to the crystal structure. Additionally, the thermodynamically metastable compounds allow verification of the correlations between the soft phonon mode of the $M_{1-x}$ atom and the low thermal conductivity. A "thermodynamically metastable" compound is a compound that is not in thermodynamic equilibrium (i.e., is not in the configuration possessing the lowest possible free energy) but does not possess sufficient thermal energy to transform into the thermodynamic equilibrium configuration (i.e., transform into the thermodynamically stable counterpart compound(s) or elemental component(s)).

All of the thermodynamically metastable skutterudite crystalline structures of the present invention appear to have larger or "expanded" unit-cell sizes relative to corresponding thermodynamically stable compounds (See Examples I–VII). An expanded unit cell appears to have certain effects on the transport properties of a compound, with one of the most pertinent effects being to reduce the bandwidths and, therefore, increase the effective mass of carriers in the compound. An increase in the effective mass of carriers in the metastable compound of the present invention, in turn, increases the compound's thermopower, and decreases the compound's electrical and thermal conductivity.

One group of thermodynamically metastable compounds of the present invention "replaces" the relatively large and light cation of the thermodynamically stable filled skutterudite compound with an atom (generally a cation) having a smaller ionic radius but heavier atomic mass. The smaller ionic radius and heavier atomic mass further disrupt the thermal conductivity of the compound due to a change in lattice vibrations. These compounds may comprise thermodynamically metastable skutterudite crystalline-structured compounds with smaller, rare earth cations in the unit-cell site 2(a) (i.e., the $M_{1-x}$ site). A "rare earth" cation is any cation of the group of chemical elements having atomic numbers 58 to 71.

In another embodiment of the present invention the thermodynamically metastable compounds comprise any of various skutterudite crystal structures having a relatively small divalent or tetravalent cation within the 2(a) crystalline unit-cell site. The thermal conductivity of the compound may be optimized for a particular purpose by taking advantage of the large thermo-vibration amplitude through placement of a small divalent or tetravalent cation in the interstitial site of the metastable skutterudite crystalline-structured compound. For example, to decrease the thermal conductivity, a thermodynamically metastable skutterudite crystalline-structured compound having Hf or Zn as the interstitial cation can be synthesized.

The present invention also provides compounds in which the skutterudite crystalline structure is "doped" by varying the total number of electrons occupying the interstitial sites. That is, the total number of electrons may be varied by producing a partial occupancy of the atom in the interstitial unit-cell site 2(a). For example, a thermodynamically metastable skutterudite crystalline-structured compound of the present invention having partial occupancy of the interstitial site may comprise $La_{0.81}Fe_{4.17}Sb_{12}$ (see Example I). Alternatively or additionally, varying the occupancy of the M'$_{4-y}$ atoms in the 8(c) unit-cell site alters the electrical conductivity of the material. Accordingly, the thermoelectric properties of skutterudite crystalline-structured compounds are optimized via partial filling of the atomic sites in the unit cell.

The metastable compounds of the present invention may also comprise "doped" skutterudite crystalline-structured compounds wherein impurities are added to M' and/or M". Such addition to the structure may change the thermoelectrical properties of the resulting crystalline material due to an overall change in the electron density in the crystalline material. Since the electrons act as carriers within these compounds, an increase in electron density increases the thermopower while decreasing the electrical and thermal conductivity capabilities of the compound.

Other compounds of the present invention comprise skutterudite crystalline-structured compounds wherein vacancies are introduced to particular atomic sites to optimize the thermoelectric properties thereof. For example, in the metastable compound $Fe_4Sb_{12}$ (i.e., $FeSb_3$), the 2(a) unit-cell site is left vacant or "unfilled." Vacancies in the interstitial site of the metastable skutterudite crystalline-structured compound (i.e., where x=0) create a thermodynamically metastable compound enhancing the ability to optimize the thermoelectric properties of the compound.

Other compounds of the present invention comprise thermodynamically metastable crystalline-structured superlattices containing one or more of the above-described metastable skutterudite crystalline-structured compounds. A "superlattice" is an ordered arrangement of atoms in a solid-solution which forms a lattice superimposed on the normal solid-solution lattice. A superlattice of the present invention comprises an ordered arrangement of two or more parent compounds in a solid solution which forms lattices superimposed upon one another. The parent compounds comprise any of the thermodynamically metastable skutterudite crystalline-structured compounds described above. For example, a thermodynamically metastable crystalline-structured superlattice compound may comprise $[Al_{1-x}Fe_4Sb_{12}]_{4.5}[La_{1-x}Fe_4Sb_{12}]_{5.5}$.

One group of the thermodynamically metastable skutterudite crystal structure superlattices of the present invention include alternating skutterudite crystalline-structured compounds and satisfy Formula (3):

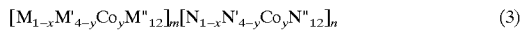  (3)

wherein:
M=any metal, metalloid, or mixture thereof;
M'=Fe, Ru, Os, Rh, or mixture thereof, wherein M' is doped or undoped;
M"=Sb, As, P, Bi, $Ge_{0.5-w}Se_{0.5+w}$ wherein w=0 to 0.5, or mixture thereof, wherein M" is doped or undoped;
x=0 to 1;
y=0 to 4;
N=any metal, metalloid, or mixture thereof;
N'=Fe, Ru, Os, Rh, or mixture thereof, wherein N' is doped or undoped;
N"=Sb, As, P, Bi, $Ge_{0.5-w}Se_{0.5+w}$ wherein w=0 to 0.5, or mixture thereof, wherein N" is doped or undoped; and
n and m represent a quantity greater than 0 and, typically, are integers.

Accordingly, superlattice-structured compounds according to Formula 3 include alternate, but repeating layers of two or more of the skutterudite crystalline-structured compounds (i.e., a superlattice reactant or repeat unit) of the present invention. Put another way, the superlattice structure of the present invention satisfying Formula 3 comprises interwoven layers of the elements of the skutterudite crystalline-structured compound within a superlattice crystal. Subsequent annealing results in interfacial nucleation and growth of the constituent skutterudite-structured compounds (i.e., first and second repeat units) which kinetically traps the desired superlattice structure.

The thermodynamically metastable superlattice skutterudite crystalline-structured compounds permit tailoring of the thermoelectric properties as well as other physical properties of the compounds as a function of the particular individual metastable compounds (i.e., the parent compounds) in the superlattice structure and the compositional layer thicknesses of the parent compounds.

Yet another group of thermodynamically metastable skutterudite crystalline-structured superlattices of the present invention include alternating skutterudite 492 crystalline-structured compounds and non-skutterudite compounds generally satisfying Formula (4):

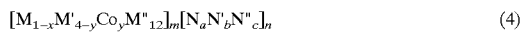  (4)

wherein:
M=any metal, metalloid, or mixture thereof;
M'=Fe, Ru, Os, Rh, or mixture thereof, wherein M' is doped or undoped;
M"=Sb, As, P, Bi, $Ge_{0.5-w}Se_{0.5+w}$ wherein w=0 to 0.5, or mixture thereof, wherein M" is doped or undoped;
x=0 to 1;
y=0 to 4;
N=Ga, Al, Zn, Cd, Cu, or mixture thereof;
N'Si, Ge, Sn, In, or mixture thereof;
N"=As, S, P, Se, N, C, or mixture thereof;
a=1 or 2;
b=0 or 1;
c=1, 2, or 3; and
n and m represent a quantity greater than 0 and, typically, are integers; or N, N', and N" are, together, any ternary sulfide with a chalcopyrite structure or any ternary selenide with a chalcopyrite structure.

A "chalcopyrite structure" is a cubic, close-packed arrangement of S or Se atoms with alternate, regular or random occupation of the tetrahedral holes in the structure by other atoms, such as Cu/In, Zn/Ge, Ag/Al, and Cu/Fe.

Thermodynamically metastable compounds having the skutterudite-structured component/non-skutterudite component superlattice structure satisfying Formula 4 generally possess superior thermoelectric properties, as the non-skutterudite component of the superlattice structure can be larger band gap semiconductor materials (e.g., about greater than 0.5 eV) than any of the thermodynamically metastable skutterudite-structured components of the superlattice structure.

Currently preferred non-skutterudite components of the superlattice structures of the present invention include those non-skutterudite components having common anions with the skutterudite crystalline-structured component of the superlattice. For example, currently preferred superlattice compounds of the present invention include antimony-based skutterudite crystalline-structured components, such as $Hl_{1-x}Fe_4Sb_{12}$, with AlSb, GaSb, or $ZnSnSb_2$ as the non-skutterudite component(s) of the superlattice. When the superlattice structure of the present invention includes skutterudite-structured components and non-skutterudite components that possess common anions, impurity complications during synthesis of the superlattice structure are significantly reduced. Put another way, the more elements necessary during synthesis (due to uncommon anions of the components), the greater the risk that some elements will act as an impurity in a reactant layer of another element, and thereby form undesirable compounds within the superlattice structure. Moreover, when the non-skutterudite component and the skutterudite-structured component of a superlattice of the present invention have common anions, they are generally lattice-matched components (i.e., the alternating components possess similar unit cell sizes), which provides superior interfacing between the component layers of the superlattice.

The thermodynamically metastable skutterudite crystalline-structured compounds of the present invention, and their capability to optimize the thermoelectric properties, possibly result in compounds having the highest Figure of Merit (i.e., highest ZT value) of any known solid-state thermoelectric material.

Synthesis of Thermodynamically Metastable Skutterudite Crystalline-Structured Compounds The following discussion focuses on the synthesis of the metastable skutterudite crystalline-structured compounds;

however, the same synthesis techniques can be used to prepare the thermodynamically metastable compounds having a superlattice crystalline structure with added "toggling" between modulated elemental reactants of the superlattice. An embodiment of the superlattice skutterudite crystalline-structured compound is described in Example VIII.

In general, the thermodynamically metastable crystalline compounds having the skutterudite crystal structure are prepared through controlled crystallization of amorphous reaction intermediates formed by low-temperature interdiffusion of modulated elemental reactants. The modulated elemental reactants are generally produced by layering thin films of the elements wherein the layers are thin enough that they will interdiffuse at low temperatures, forming an amorphous reaction intermediate, before they nucleate (i.e., crystallize). The amorphous reaction intermediate for each system nucleates exothermically near 200° C. forming the desired thermodynamically metastable skutterudite crystalline-structured compound. At temperatures above 500° C. the metastable compounds decompose exothermically forming a thermodynamically stable mixture of binary compounds and elemental components.

Specifically, the thermodynamically metastable compounds of the present invention comprise crystalline alloys of two or more solid-state reactants and are produced on a surface of a solid substrate, such as a silicon wafer. Each crystalline alloy is formed by first forming modulated elemental reactants, or "repeat units," of reactant layers superposedly on the substrate surface. Each repeat unit may contain the same number of elemental layers (or a different number if a superlattice crystalline structure is to be produced as discussed below).

The stoichiometry of the desired crystalline alloy is determined by the relative thicknesses of the elemental reactant layers comprising the repeat units. When at least three reactants are used, the stoichiometry is determined in part by the number of layers of a particular reactant in a repeat unit relative to the number of layers of each of the other reactants in the repeat unit.

Modulated elemental reactants are typically prepared using an ultra-high-vacuum deposition apparatus. The repeat units are prepared on substrate wafers comprised of materials such as (but not limited to), silicon, quartz, or float glass. A group of such wafers is typically mounted in the vacuum chamber of the deposition apparatus on sample mounts to undergo planetary rotation in a vacuum chamber during deposition. Reactant layers can be deposited on the wafers using any of various methods known in the art including, but not limited to, sputtering, vapor deposition, and electron-beam gun deposition. Deposition rates typically are adjusted within a range of about 0.5–2 Å per second. Deposition rates may, however, be much higher dependent upon variables known to those skilled in the art. The vacuum in the chamber during deposition is typically between $10^{-8}$–$10^{-9}$ Torr.

Layers, when deposited, can be either amorphous or crystalline (as can be determined via x-ray diffraction). Interdiffusion of either type of layer must be conducted at a temperature that will overcome the activation energy of diffusion for the various layers. In general, the activation energy of diffusion for crystalline reactants is higher than for amorphous reactants. After forming a repeat unit of the reactants on the substrate, the repeat units are heated to an interdiffusion temperature for the reactants. The interdiffusion temperature is less than the nucleation temperature for the reactants. The magnitude of the interdiffusion temperature depends on the particular reactants and the stoichiometry of the reactants comprising the repeat unit. A suitable interdiffusion temperature, generally in the range of several hundred degrees Celsius, can be readily determined by performing differential scanning calorimetry (DSC) of the modulated composite using methods generally known in the art. The interdiffusion temperature is properly maintained until the reactants have achieved a homogeneous interdiffusion, thereby forming a homogeneous amorphous alloy of the reactants.

After forming the amorphous alloy, the amorphous alloy is heated to a nucleation temperature. The nucleation temperature is maintained until the amorphous alloy becomes fully crystallized With certain alloys, however, once nucleation begins, crystallization will progress to completion even when the temperature of the alloy is reduced to below the nucleation temperature before crystallization is complete.

For any modulated composite, there is a critical thickness parameter which is the maximum repeat-unit thickness than can interfuse to homogeneity without necessarily triggering nucleation In general, keeping the repeat-unit thickness to about 100 Å or less effectively allows formation of a homogeneous amorphous alloy of the reactants without nucleation.

EXAMPLE I

This is an example of a thermodynamically metastable ternary crystalline compound having a partial occupancy of the cation, $M_{1-x}$, in the skutterudite crystal unit-cell site $2(a)$. The metal ($M'_{y-4}$) unit-cell site is also varied. The metastable compound synthesized in this example is $La_{0.81}Fe_{4.17}Sb_{12}$.

SAMPLE PREPARATION: A custom-built deposition chamber within independently controlled deposition sources was used to prepare the repeat units of the metastable compound. The elements were deposited at a rate of 0.5 Å per second using Thermionics™ electron-beam gun sources each controlled by Leybold-Inficon XTC quartz crystal thickness monitors. The background pressure in the chamber was maintained below $1\times10^{-7}$ Torr during deposition. Multilayer films were simultaneously deposited on two adjacent substrates, one polished silicon wafer (±3 Å rms) (or a miscut quartz zero-background plate) and one polymethylmethacrylate (PMMA) coated wafer. The samples deposited on the polished wafer were used for low-angle x-ray diffraction measurements. The samples deposited on the miscut quartz zero-background plate were used to collect high-angle x-ray diffraction data for Reitveld refinement. The films on the PMMA-coated wafers were removed from the substrates by immersing the wafers in acetone. The suspended samples were filtered and washed to remove dissolved PMMA and then dried on teflon filters.

The thermodynamically metastable compound $La_{0.81}Fe_{4.17}Sb_{12}$ was prepared by sequential evaporation of the elements lanthanum, iron, and antimony, from three electron-beam evaporation sources. The elements could be reasonably expected to interdiffuse before crystallizing. Before annealing to cause nucleation, the samples were characterized using low-angle x-ray diffraction and elemental analysis by energy-dispersive x-ray analysis in an electron microscope (i.e., a microprobe). Low-angle x-ray data indicated that the multi-layer repeat distance was 21 Å and that the elements were significantly interdiffused, but still layered. Microprobe analysis indicated that the average composition of the ternary metastable compound was $La_{0.81}Fe_{4.17}Sb_{12}$.

Figure 2:
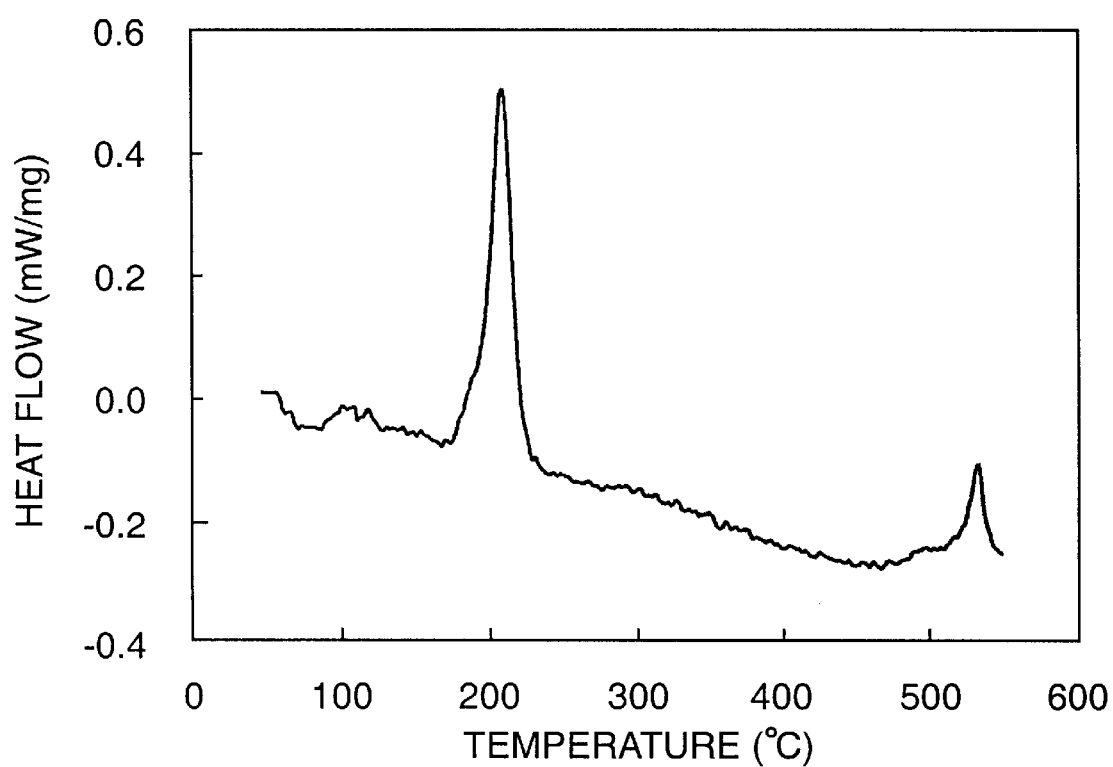
FIG. 2 shows Differential Scanning Calorimetry data for a $La_{0.81}Fe_{4.17}Sb_{12}$ sample, indicating an exotherm at 210° C. for crystallization of $La_{0.81}Fe_{4.17}Sb_{12}$ and an exotherm at 535° C. from the decomposition of $La_{0.81}Fe_{4.17}Sb_{12}$, into $LaFe_4Sb_{12}$, La, Sb, and $FeSb_2$ (Example I).

The samples were annealed in a differential scanning calorimeter at a scan rate of 10° C. per minute (FIG. 2). The differential scanning calorimeter results show two irreversible exotherms upon heating, one at 210° C. and one at 535° C. Diffraction data collected after heating to 250° C. and 550° C. are shown in FIGS. 3a and 3b and indicate that the first exotherm results from the formation of the desired thermodynamically metastable partially-filled skutterudite compound while the second exotherm results from the decomposition of this metastable compound into a mixture of thermodynamically stable binary compounds and elemental components. That is, the second exotherm results in the decomposition of the thermodynamically metastable compound of the present invention and contains the thermodynamically stable product obtained from conventional high-temperature synthesis.

Figure 4:
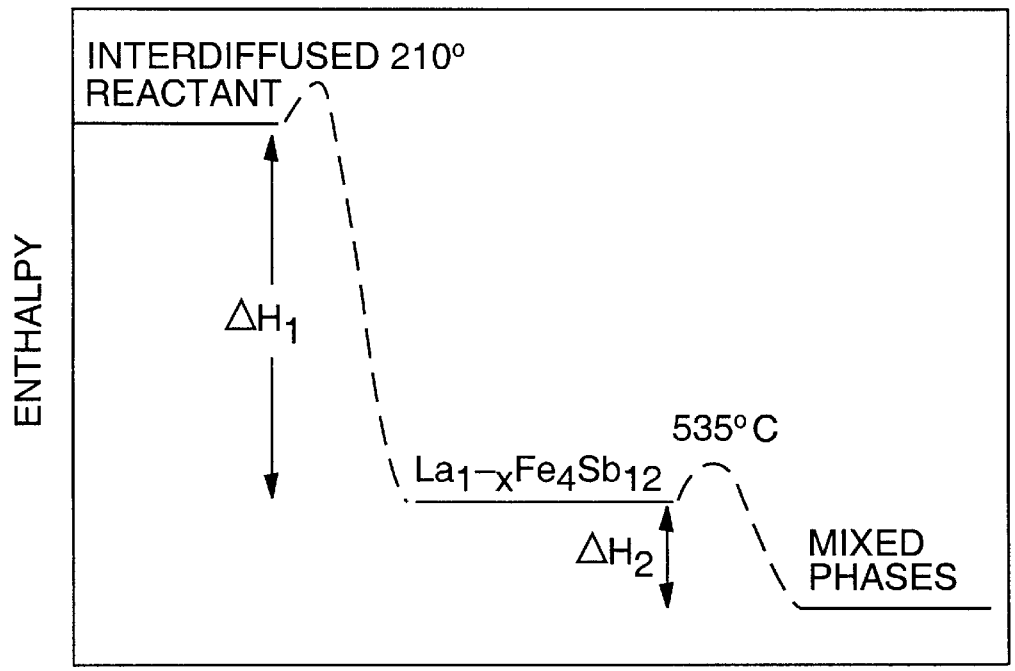
FIG. 4 is an Energy Diagram showing enthalpy changes of a $La_{0.81}Fe_{4.17}Sb_{12}$ sample during heating from room temperature (Example I).

From the calorimetry data, an energy diagram as a function of the reaction progress was created as shown in FIG. 4. The energy difference between the reactants and the initial skutterudite compound was the integrated heat from the low-temperature exotherm. The energy diagram shows enthalpy changes of the $La_{0.81}Fe_{4.17}Sb_{12}$ sample during heating from room temperature with a first transition, $\Delta H=126$ kJ/mole, and a second transition, $\Delta H=34$ kJ/mole. The $La_{0.81}Fe_{4.17}Sb_{12}$ compound is only kinetically stable, however, being thermodynamically metastable relative to a mix of binary compounds by the integrated heat of the second exotherm. This provides the necessary information to optimize the crystallinity of the metastable skutterudite structured compound of the present invention. TEM images show that substantial grain growth occurs between 250° C. and 400° C. without any evidence of decomposition of this metastable product.

COMPOSITIONAL ANALYSIS: Electron-probe microanalysis (EPMA) was used to determine the composition of all as-deposited samples. Portions of the sample collected on TEFLON® (polytetrafluorethylene, a product od E.I. Du Pont de Nemours and Co. filters (approximately 9 mm$^2$) were adhered to a glass substrate by double-sided conductive carbon tape. The microprobe data were collected on a Cameca S-50 electron-probe using a 10-keV accelerating voltage, a 10-nA beam current, and a 1-$\mu$m spot size.

X-RAY DIFFRACTION: Diffraction data was collected using Scintag SDS-2000 theta-theta diffractometer with a sample stage modified to allow rapid and precise alignment for low-angle measurements. The low-angle diffraction pattern resulting from the periodic layered structure of the as-deposited sample was used to determine repeat-unit thicknesses and widths of the repeat-unit profiles between elemental layers. High-angle diffraction data were used to identify crystalline elements of compounds in the as-deposited films and the free-standing samples, as a function of annealing temperature and time. A quartz zero-background plate was used as a sample support for all high-angle work.

DIFFERENTIAL SCANNING CALORIMETRY (DSC): The evolution of the samples as they were subjected to elevated temperatures to cause nucleation was monitored using a TA Instruments TA9000 calorimeter, fitted with a 910 DSC cell. Approximately 1 mg of sample was placed into an aluminum pan and sealed by crimping. The sample was heated from ambient temperature to 550° C. at rates of 10° C. per minute under flowing nitrogen and then allowed to cool back to room temperature. Without disturbing the sample or instrument, this cycle was repeated to measure reversible transitions in the sample as well as the cell background. The heat flow associated with the irreversible changes occurring in the sample during the initial heating cycle were determined by subtracting the data collected during the second cycle from those collected during the first cycle.

To further characterize the metastable skutterudite crystalline-structured compound $La_{0.81}Fe_{4.17}Sb_{12}$ formed after the initial exotherm, a Reitveld refinement of the structure was undertaken. The results of this structural refinement are shown in Table 1 and the simulated diffraction pattern is shown in FIG. 5. The single La peak at 57° C., two $FeSb_2$ peaks at 31° C. and 35° C., respectively, and the Sb peak at 28° C. were also included in the refinement (see FIG. 5). The line through the data is the calculated pattern and a difference plot is provided below this line.

TABLE 1

| Space Group Im$\bar{3}$ | La 2(a) | Fe 8(c) | Sb 24(g) |
| --- | --- | --- | --- |
| x | 0 | 1/4 | 0 |
| y | 0 | 1/4 | 0.3335(5) |
| z | 0 | 1/4 | 0.1572(5) |
| B | 10(2) | 1.7(3) | 1.9(1) |
| occupancy | 0.4–0.7 | 1 | 1 |

The structure of the low-temperature, thermodynamically metastable skutterudite crystalline-structured compound having a partial occupancy of the lanthanum is similar to that for $LaFe_4Sb_2$. The low-temperature metastable compound of the present invention, however, has a partial occupancy of the lanthanum site (i.e., the cation unit-cell site 2(a)) and a significantly larger unit-cell than that reported for a corresponding product synthesized at conventional high temperatures. That is, the high-temperature product $LaFe_4Sb_{12}$ has a unit-cell of 9.1957 Å versus the unit-cell size of 9.1395 Å for the metastable skutterudite crystalline-structured compound $La_{0.81}Fe_{4.17}Sb_{12}$.

Without being bound to a particular theory, we suggest a lanthanum non-stoichiometry arose from the low lanthanum content of the initial reactant. Additionally, some of the difference in lattice parameter may be due to the lanthanum being a source of bonding electrons for the iron-antimony framework. A reduction in the number of these electrons due to a partial occupancy of the lanthanum causes the framework to expand. It is not possible to prepare this low-temperature, metastable, partially filled skutterudite crystalline-structured compound of the present invention via conventional high-temperature methods. During conventional synthesis the 535° C. exotherm causes the lattice parameter of the skutterudite crystalline structure to contract, forming the previously known, high-temperature filled skutterudite $LaFe_4Sb_{12}$ as part of a mixture containing $FeSb_2$, elemental antimony, and elemental lanthanum.

EXAMPLE II

Figure 6:
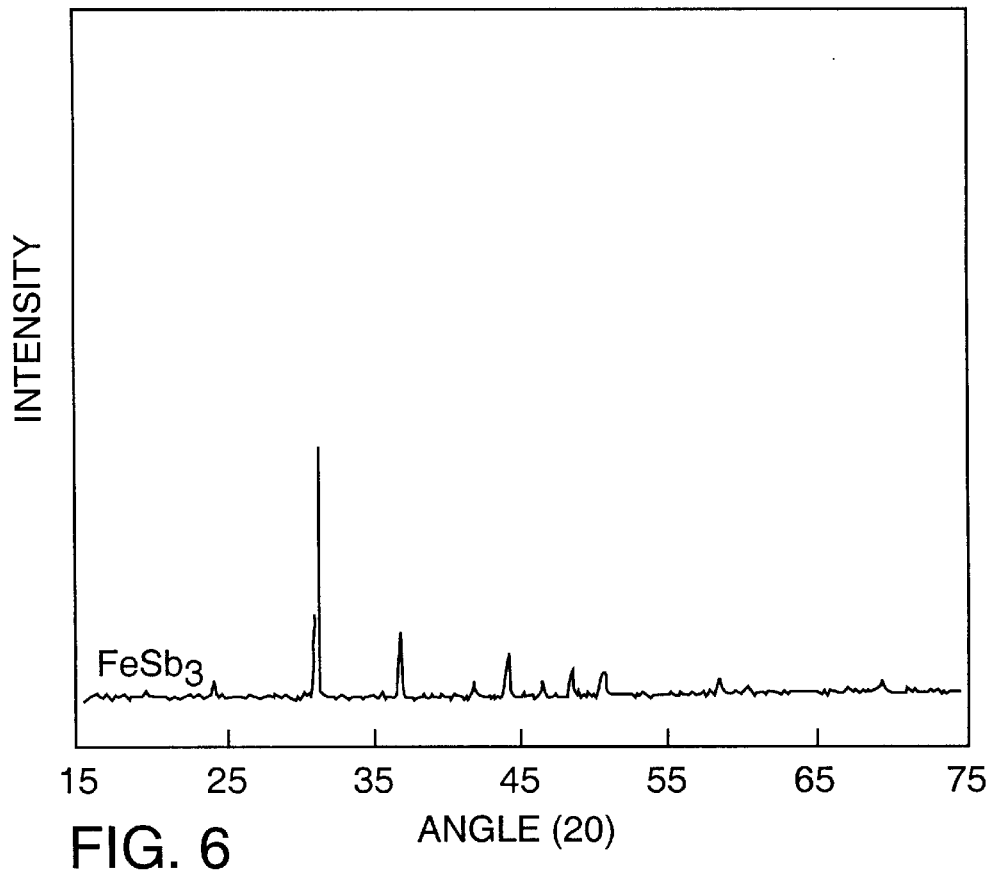
FIG. 6 shows an X-ray Diffraction pattern of a sample comprising $FeSb_3$ after the first exotherm (Example II).

Example II illustrates the synthesis of a metastable skutterudite crystalline-structured compound of the present invention wherein the thermodynamically metastable parent binary compound, $Fe_4Sb_{12}$, is synthesized. The sample preparation, compositional analysis, x-ray diffraction, and differential scanning calorimetry, were performed as described above in Example I. FIG. 6 shows the resulting diffraction pattern of the new metastable skutterudite crystalline-structured compound $Fe_4Sb_{12}$. The metastable compound $Fe_4Sb_{12}$ decomposed to a mixture of binary compounds upon heating to 550° C.

The low-angle diffraction pattern of the binary sample on deposition shows diffraction maxima resulting from front surface—back surface interference of the Cu—Kα x-rays used as well as a first-order Bragg diffraction maxima from the repeating unit of the multi-layer. The front surface—back surface interference pattern continues out to significantly higher diffraction angles. High-angle diffraction studies indicate that the film is still amorphous after this 100° C. annealing.

After annealing the intensity of the Bragg diffraction maxima is significantly reduced as a result of interdiffusion of the deposited layers. Unexpectedly, unlike most known solid-state compounds, annealing the thin film also resulted in a smoother thin-film surface. A smoother film surface may be useful for compounds of the present invention that are utilized in the semiconductor industry, where smooth surfaces reduce or nullify the need to planarize.

Figure 7:
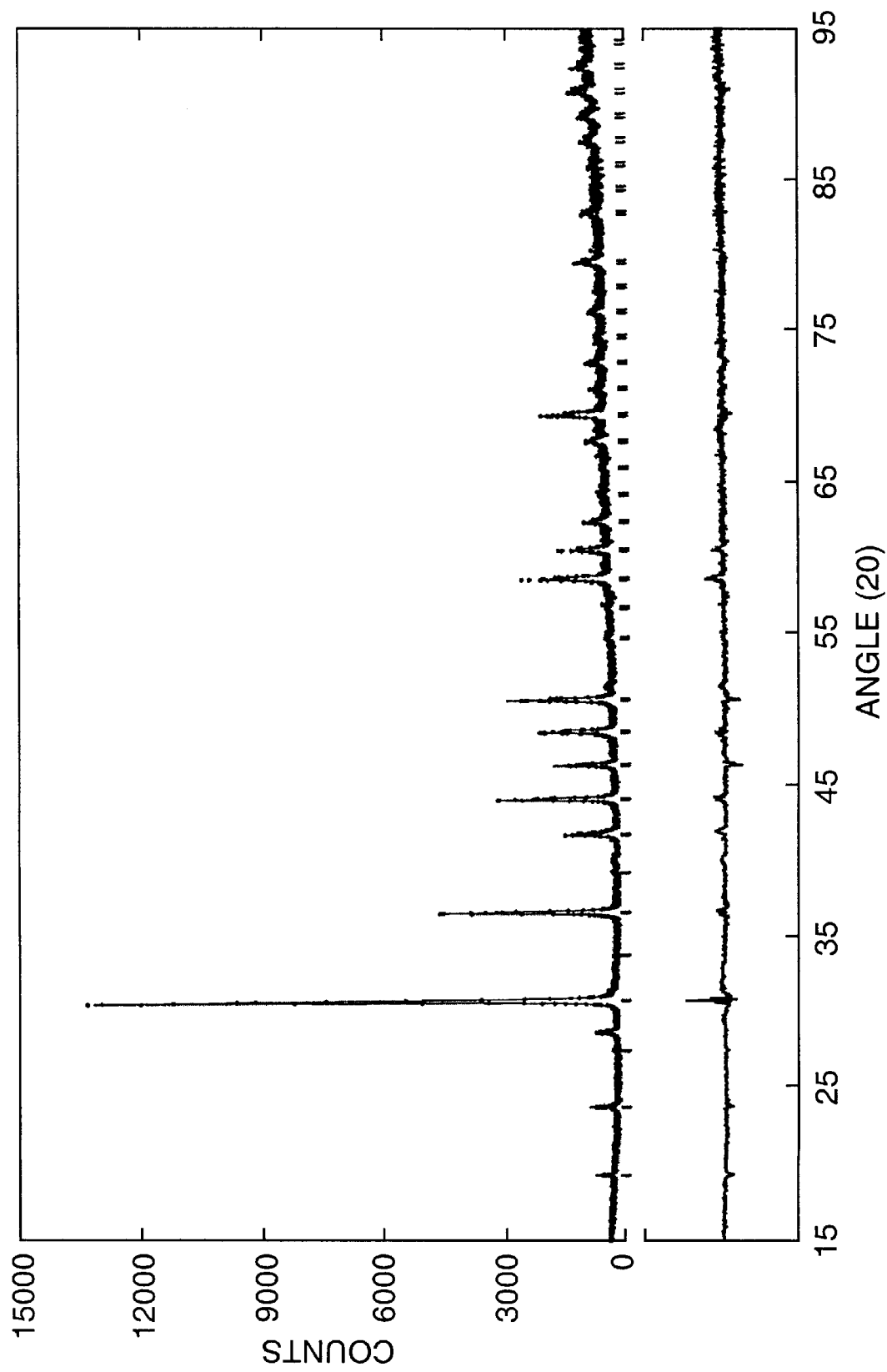
FIG. 7 shows the results of Reitveld Refinement performed on a sample comprising $Fe_4Sb_{12}$ (Example II).

Annealing a film at higher temperatures, e.g., 250° C., for seven hours results in a film suitable for Reitveld refinement. The resulting structural parameters are summarized in Table 2. FIG. 7 shows the results of the Reitveld refinement performed on the $Fe_4Sb_{12}$ sample. Diffraction peaks from the skutterudite structure are marked with vertical bars. The line through the data is the calculated pattern and a difference plot is given underneath the line (FIG. 7).

TABLE 2

| $Im\overline{3}$ | Fe<br>8(c) | Sb<br>24(g) |
|---|---|---|
| x | 1/4 | 0 |
| y | 1/4 | 0.3400(2) |
| z | 1/4 | 0.1618(2) |
| B | 1.7(3) | 0.95(7) |

The structure of this new binary metastable skutterudite crystalline-structured compound, $Fe_4Sb_{12}$, is similar to that previously determined for the known, thermodynamically stable compound $CoSb_3$. The new, thermodynamically metastable skutterudite crystalline-structured compound $Fe_4Sb_{12}$ has a significantly larger unit-cell size than reported previously for filled skutterudites (i.e., 9.1763 Å versus 9.13954 Å for $LaFe_4Sb_{12}$) which suggests that a reduction of the number of framework electrons resulting from reducing the occupancy of the cation, unit-cell site 2(a), now to 0, causes the framework to expand.

This example illustrates the ability to synthesize new, thermodynamically metastable binary compounds having a skutterudite crystalline structure. In this example, as with the other examples, we have taken advantage of the ability to control nucleation kinetics using the average composition of the reactant. At the low nucleation temperature observed for synthesizing the metastable skutterudite crystalline-structured compounds, the low diffusion rate prevents disproportionation of the amorphous intermediates into more thermodynamically stable binary and elemental components previously known.

Figure 8:
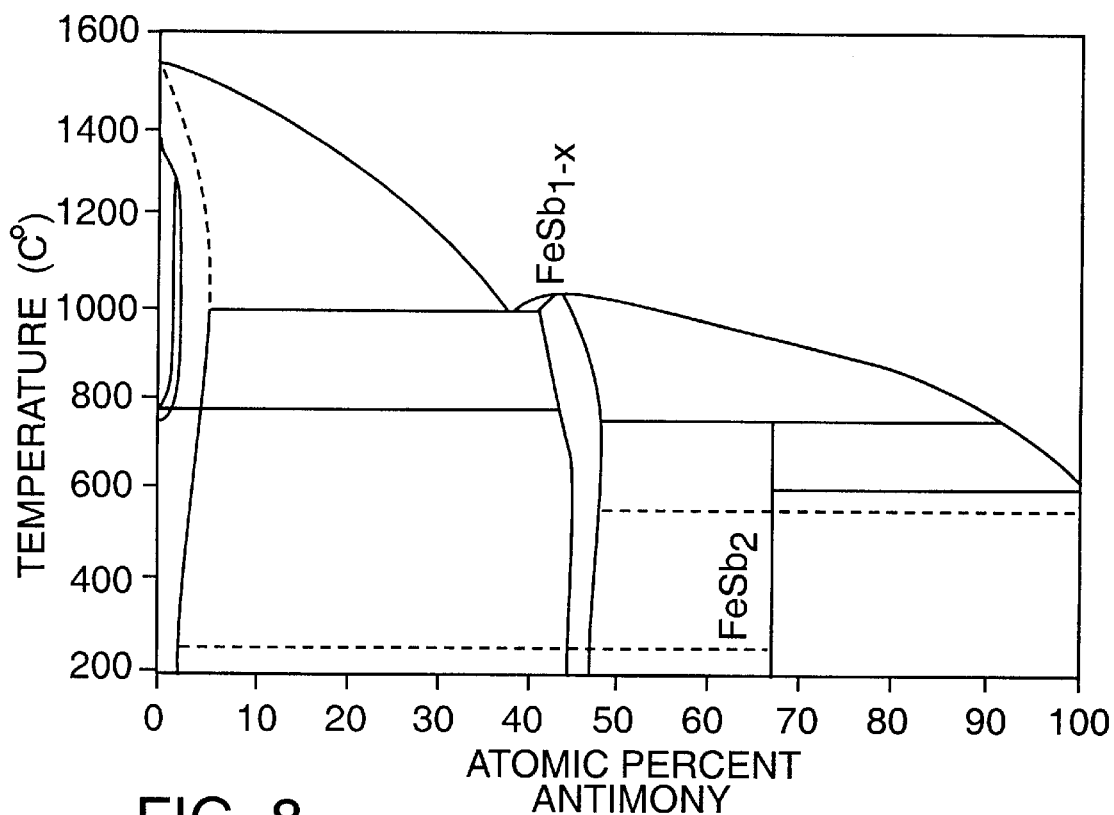
FIG. 8 shows a schematic of an iron-antimony Phase Diagram (Example II).

The instability of the low-temperature amorphous intermediate is clearly significant in the case of this new binary metastable skutterudite crystalline-structured compound, $Fe_4Sb_{12}$. This compound is not stable with respect to a mixture of $FeSb_2$ and Sb as found in the accepted phase diagram shown in FIG. 8. Such a compound would be very difficult or impossible to prepare using conventional high-temperature synthesis, where the elements must be heated to above 600° C. to obtain measurable reaction and diffusion.

EXAMPLE III

In Example III a relatively small trivalent cation, yttrium, was combined with iron and antimony to form a thermodynamically metastable ternary compound having the skutterudite crystal structure. The ionic radius of yttrium is 0.90 Å, compared with the 1.03 Å ionic radius of lanthanum. As in the synthesis of previous examples, the compound illustrated in this example was synthesized by layering the desired elements to yield an initially layered reactant with a repeat thickness of approximately 20 Å and a composition near that of the desired thermodynamically metastable compound. All of the elements were deposited at a rate of 0.5 Å per second as described above.

The compositional analysis, x-ray diffraction, and differential scanning calorimetry were all performed as discussed above in Example I.

Figure 9:
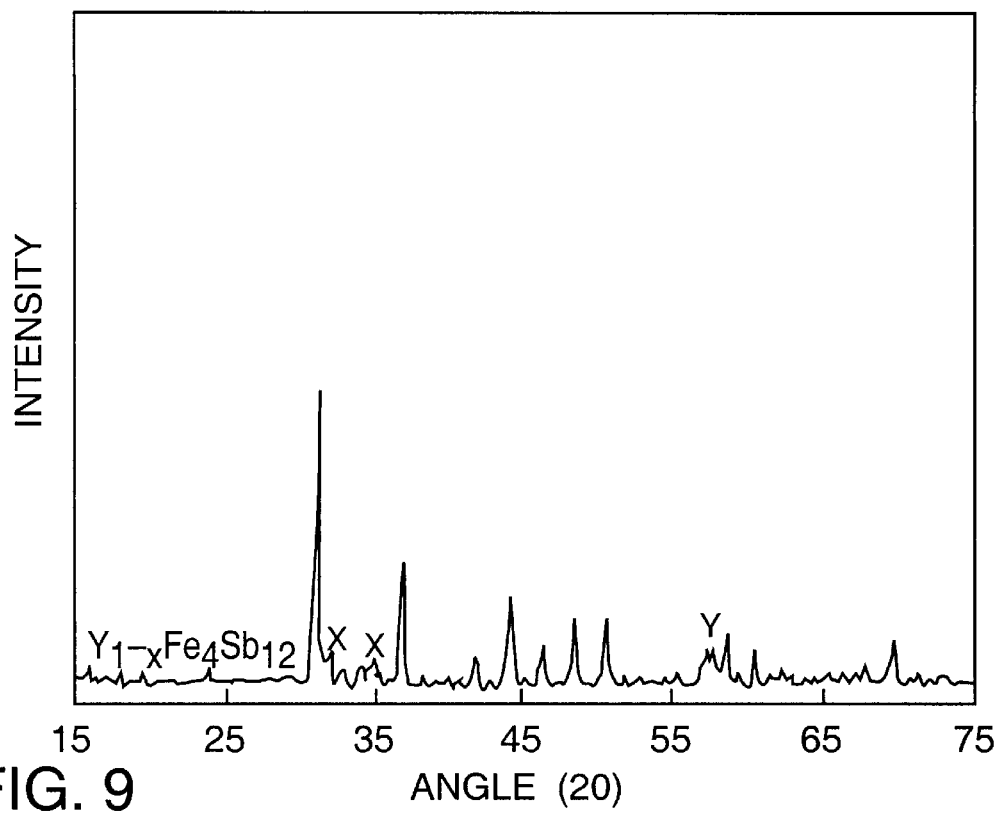
FIG. 9 shows an X-ray Diffraction pattern of a $Y_{1-x}Fe_4Sb_{12}$ sample (Example III).
Figure 10:
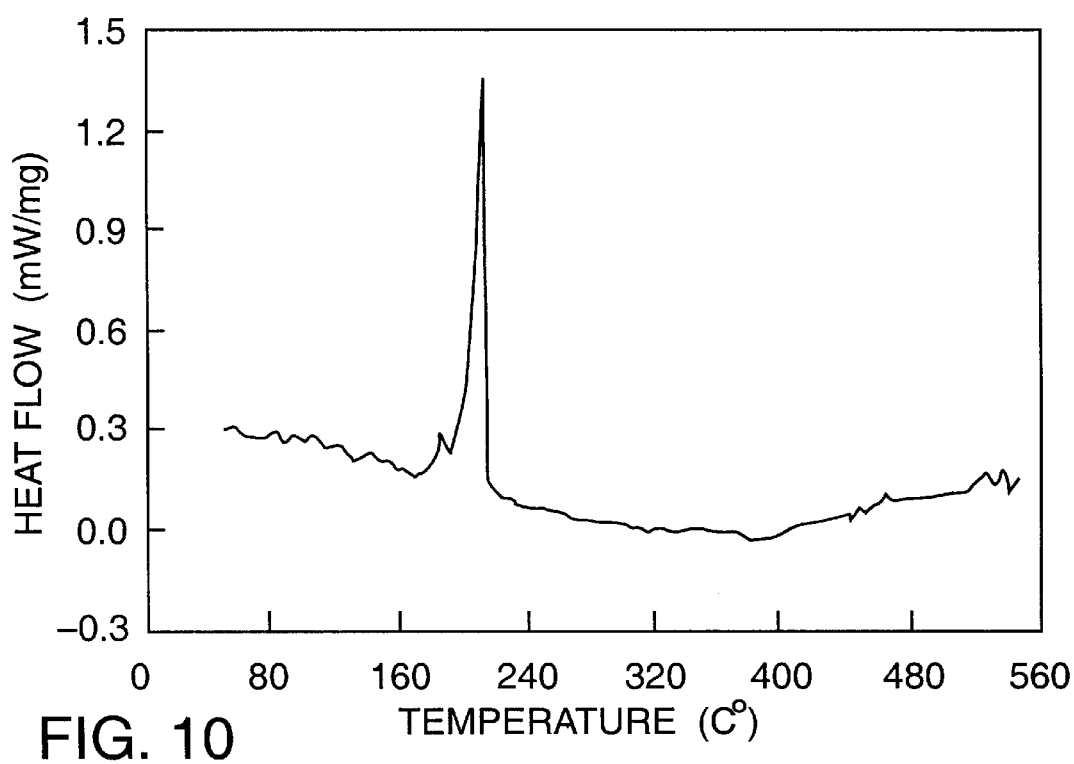
FIG. 10 shows Differential Scanning Calorimetry data for a $Y_{1-x}Fe_4Sb_{12}$ sample (Example III).

In the thermodynamically metastable yttrium skutterudite crystalline-structured compound of Example III, calorimetry data of the free-standing film showed a single exotherm upon heating at 205° C. Diffraction data collected after the initial exotherm in each of the yttrium samples showed the quantitative formation of the desired metastable compound $Y_{1-x}Fe_4Sb_{12}$. FIG. 9 shows the resulting diffraction pattern of this new, metastable compound. The new compound $Y_{1-x}Fe_4Sb_{12}$ decomposed to a mixture of binary compounds and elemental components upon heating to about 400° C. to 550° C. The yttrium sample did not have a sharp high-temperature exotherm but rather underwent a slow decomposition, starting between 400° C. and 550° C. (See FIG. 10).

The low-temperature product, $Y_{1-x}Fe_4Sb_{12}$, has a relatively large unit-cell size (9.200±0.003 Å), a nucleation temperature of about 205° C. and a decomposition temperature of about 400° C. to 550° C. Although the exact composition of the metastable yttrium compound is not known, the relatively large unit-cell size of the yttrium compound, the low nucleation temperature, and the decomposition data obtained at higher temperatures suggest partial occupancy of the yttrium cation (i.e., x>0).

The synthesis of this thermodynamically metastable skutterudite crystalline-structured compound, $Y_{1-x}Fe_4Sb_{12}$, takes advantage of the ability to control nucleation kinetics using the average composition of the reactant. Accordingly, this compound would be impossible to prepare using conventional high-temperature synthesis, where the elements must be heated above 600° C. to obtain measurable reaction rates. Additionally, as discussed above, the synthesis of the new metastable skutterudite crystalline-structured compounds of the present invention enhance the ability to optimize the thermoelectric properties of materials via the relatively small and heavy cation.

EXAMPLE IV

Example IV illustrates synthesis of thermodynamically metastable compounds having a skutterudite crystal structure with a tetravalent cation in unit-cell site 2(a). The tetravalent cation hafnium was used to further optimize the thermoelectric properties of the resulting material by lowering the thermal conductivity of the skutterudite crystal structure produced. Hafnium has an ionic radius of 0.71 Å as compared with 1.03 Å for lanthanum. As in the synthesis of the compounds discussed above in Example I, the thermodynamically metastable hafnium skutterudite crystalline-structured compound was synthesized by layering the desired elements to yield an initial layered reactant with a repeat thickness of approximately 20 Å and a composition of the desired compound, $Hf_{1-x}Fe_4Sb_{12}$. The compositional analysis, x-ray diffraction, and differential scanning calorimetry were all performed as described above in Example I.

Figure 11:
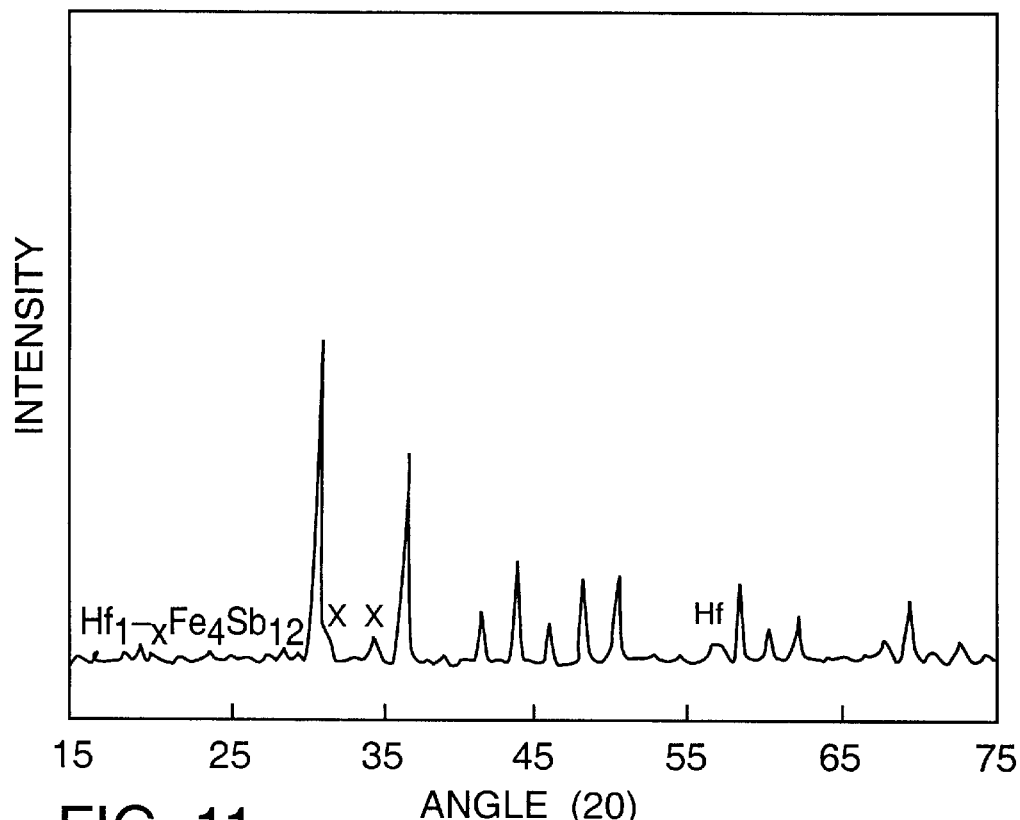
FIG. 11 shows an X-ray Diffraction pattern of a $Hf_{1-x}Fe_4Sb_{12}$ sample (Example IV).
Figure 12:
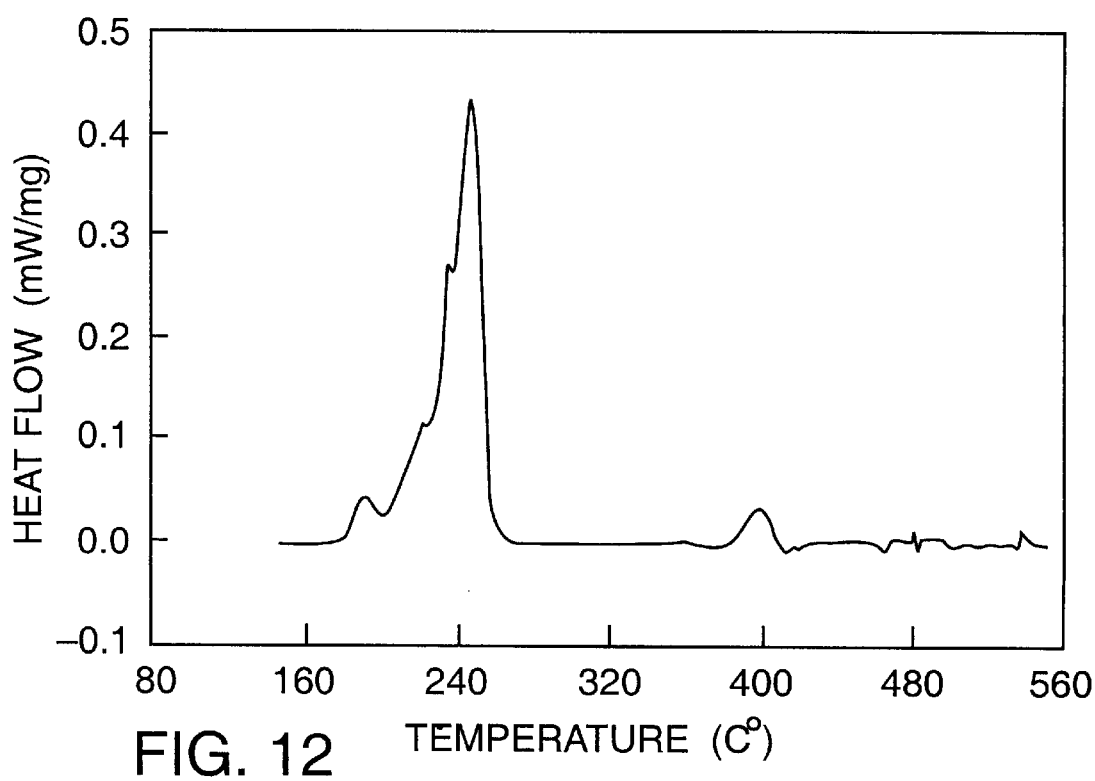
FIG. 12 shows Differential Scanning Calorimetry data for a $Hf_{1-x}Fe_4Sb_{12}$ sample (Example IV).

In the metastable hafnium skutterudite crystalline-structured compound produced, the DSC trace from the free-standing film showed two irreversible exotherms upon heating, one at 240° C. and a second at 400° C. Diffraction data collected after the initial exotherm in the hafnium compound showed the quantitative formation of the desired metastable skutterudite crystalline-structured compound, $Hf_{1-x}Fe_4Sb_{12}$. FIG. 11 shows the resulting diffraction pattern of this new compound. The compound $Hf_{1-x}Fe_4Sb_{12}$ decomposed to a mixture of binary compounds and elemental components upon heating to 550° C. (See FIG. 12).

The low-temperature product, $Hf_{1-x}Fe_4Sb_{12}$, has a relatively large unit-cell size (9.188±0.002 Å), a nucleation temperature of about 240° C. and a decomposition temperature of about 400° C. Although the exact composition of the metastable hafnium compound is not known, the relatively large unit-cell size of the hafnium compound, the low nucleation temperature, and the decomposition data obtained at higher temperatures suggest partial occupancy of the hafnium cation (i.e., x>0).

Example IV shows the ability to synthesize the new, thermodynamically metastable ternary compounds with the skutterudite crystalline structure. At the low nucleation temperature observed for the skutterudite crystalline-structured compound, $Hf_{1-x}Fe_4Sb_{12}$, the low diffusion rate prevents disproportionation of the amorphous intermediate into more thermodynamically stable binary and elemental components. Such a metastable ternary compound would be impossible to prepare using conventional high-temperature synthesis where the elements must be heated above 600° C. to obtain measurable reaction.

EXAMPLE V

Example V illustrates the synthesis of partially-filled, thermodynamically metastable skutterudite crystalline-structured compounds wherein the cation, in the interstitial 2(a) unit-cell site, comprises cerium, $Ce_{1-x}Fe_4Sb_{12}$, praseodymium, $Pr_{1-x}Fe_4Sb_{12}$, neodymium, $Nd_{1-x}Fe_4Sb_{12}$, promethium, $Pm_{1-x}Fe_4Sb_{12}$, samarium, $Sm_{1-x}Fe_4Sb_{12}$, europium, $Eu_{1-x}Fe_4Sb_{12}$, gadolinium, $Gd_{1-x}Fe_4Sb_{12}$, terbium, $Tb_{1-x}Fe_4Sb_{12}$, dysprosium, $Dy_{1-x}Fe_4Sb_{12}$, holmium, $Ho_{1-x}Fe_4Sb_{12}$, erbium, $Er_{1-x}Fe_4Sb_{12}$, thulium, $Tm_{1-x}Fe_4Sb_{12}$, ytterbium, $Yb_{1-x}Fe_4Sb_{12}$, or lutetium, $Lu_{1-x}Fe_4Sb_{12}$.

Figure 13:
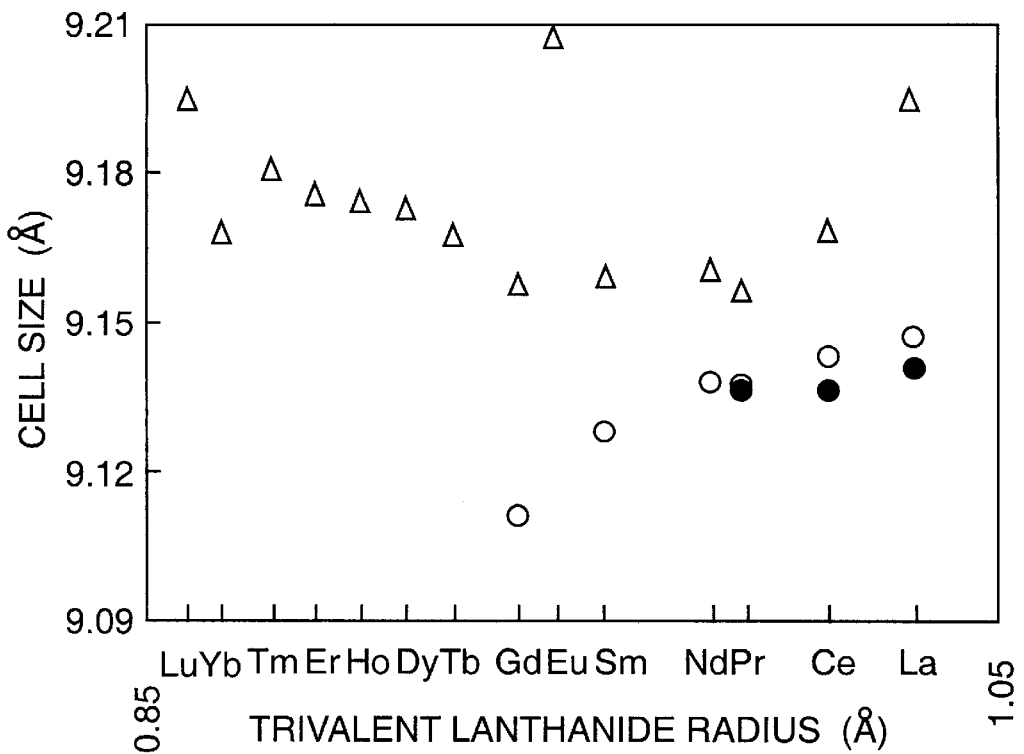
FIG. 13 shows unit-cell sizes of certain thermodynamically metastable compounds of the present invention made in Example IV.
Figure 14:
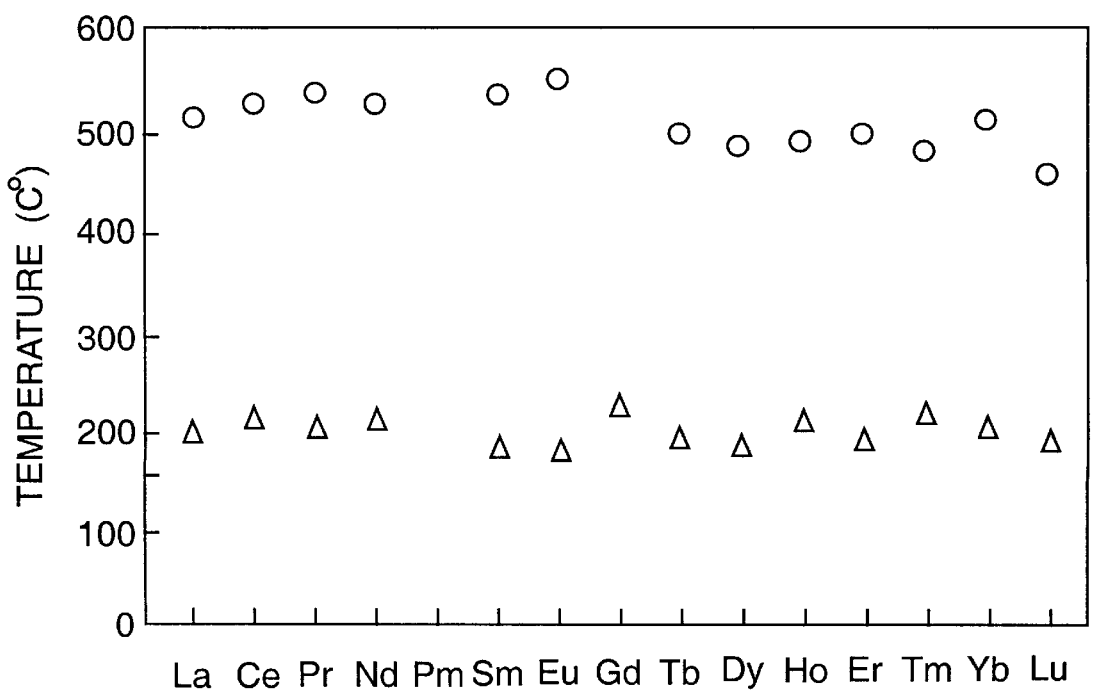
FIG. 14 shows formation and decomposition temperatures of certain thermodynamically metastable compounds of the present invention made in Example V.

Each of these metastable compounds was synthesized according to the method disclosed above in Example I. Each of these compounds comprises a partially-filled, thermodynamically metastable skutterudite crystalline-structured compound. FIG. 13 illustrates the unit-cell sizes of these new compounds indicating partial occupancy as the unit-cell sizes are larger than the corresponding filled skutterudite compounds. All of the metastable compounds in this example formed at low nucleation temperatures and decomposed to a mixture of binary compounds and elemental components upon heating above 500° C., as illustrated in FIG. 14.

The ability to prepare these metastable compounds having small radius cations in unit-cell site 2(a) optimizes the thermoelectric properties of the resulting metastable materials.

EXAMPLE VI

In Example VI a thermodynamically metastable compound with the skutterudite crystalline structure having a cation with a very small ionic radius was synthesized. The thermodynamically metastable compound of Example VI combines the cation $Al^{3+}$ (ionic radius of 0.54 Å) with Fe and Sb. As in the synthesis of previous Examples, the compound illustrated in this Example was synthesized by layering the desired elements to yield an initially layered reactant having a repeat thickness of about 20 Å and a composition near that of the desired metastable compound $Al_{1-x}Fe_4Sb_{12}$. The compositional analysis, x-ray diffraction, and differential scanning calorimetry were all performed as in Example I.

Figure 15:
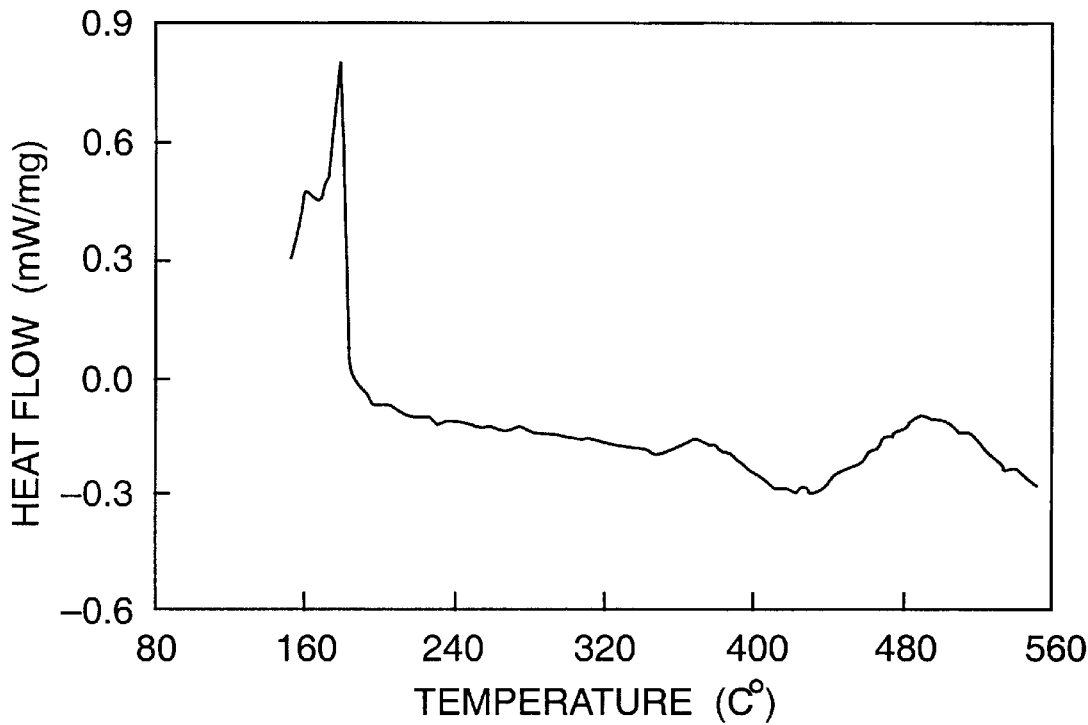
FIG. 15 shows Differential Scanning Calorimetry data for a $Al_{1-x}Fe_4Sb_{12}$ sample (Example VI).

The compound, $Al_{1-x}Fe_4Sb_{12}$, has a relatively large unit-cell size (9.30±0.02 Å), a low nucleation temperature of about 175° C., and a decomposition temperature of about 350° C. See the differential scanning calorimetry data for this sample in FIG. 15.

Although the exact composition of the compound is not known, the relatively large unit-cell size of the compound, the low nucleation temperature, and the decomposition data obtained at higher temperatures suggest partial occupancy of the aluminum cation (i.e., x>0).

EXAMPLE VII

In Example VII a thermodynamically metastable compound with the skutterudite crystalline structure having a cation with a very small ionic radius was synthesized. The thermodynamically metastable compound of Example VII combines the cation $Ga^{3+}$ (ionic radius of 0.62 Å) with Fe and Sb. As in the synthesis of previous Examples, the compound illustrated in this Example was synthesized by layering the desired elements to yield an initially layered reactant having a composition near that of the desired metastable compound $Ga_{1-x}Fe_4Sb_{12}$ (see FIG. 17). The compositional analysis, x-ray diffraction, and differential scanning calorimetry were all performed as in Example I.

Figure 16:
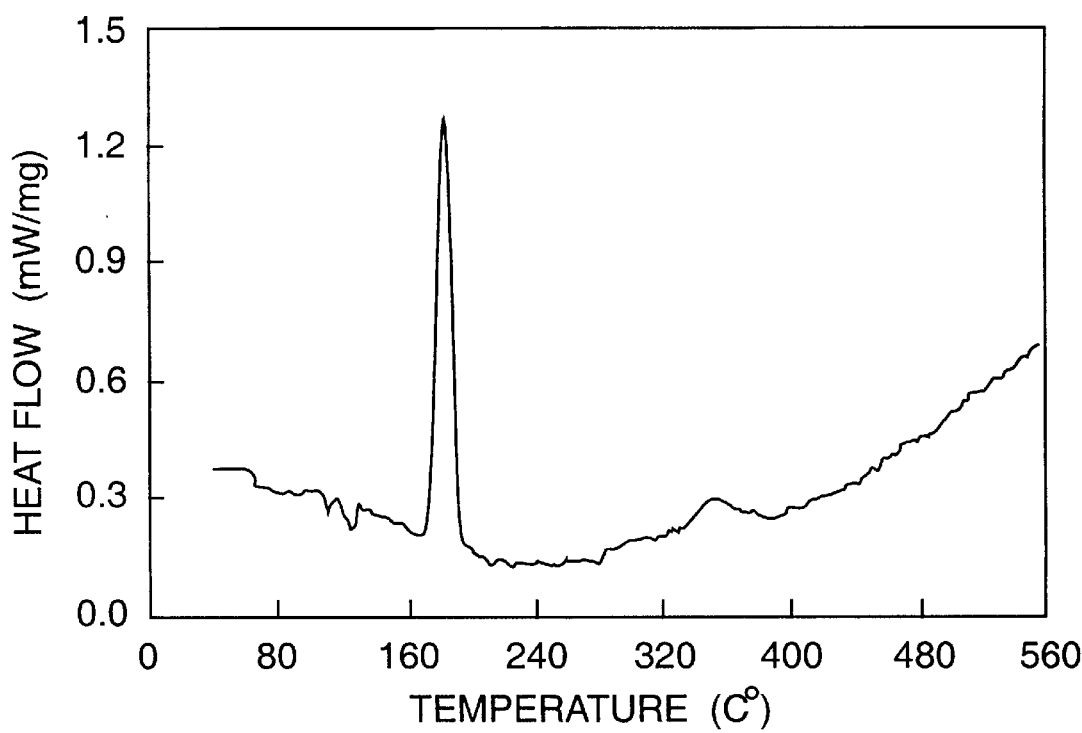
FIG. 16 shows Differential Scanning Calorimetry data for a $Ga_{1-x}Fe_4Sb_{12}$ sample (Example VII).

The compound, $Ga_{1-x}Fe_4Sb_{12}$, has a relatively large unit-cell size (9.179±0.002 Å), a nucleation temperature of about 180° C., and a decomposition temperature of about 350° C. (See the differential scanning calorimetry data for the $Ga_{1-x}Fe_4Sb_{12}$ sample in FIG. 16). Although the exact composition of the compound is not known, the relatively large unit-cell size of the compound, the low nucleation temperature, and the decomposition data obtained at higher temperatures suggest partial occupancy of the gallium cation (i.e., x>0).

EXAMPLE VIII

Example VIII illustrates the synthesis of thermodynamically metastable skutterudite crystalline-structured compounds formed in a superlattice structure. The superlattice structure of the thermodynamically metastable compounds of Example VIII combines alternating layers (i.e., repeat units) of $Sr_{1-x} Fe_4 Sb_{12}$ and $Hf_{1-x} Fe_4 Sb_{12}$.

Figure 17:
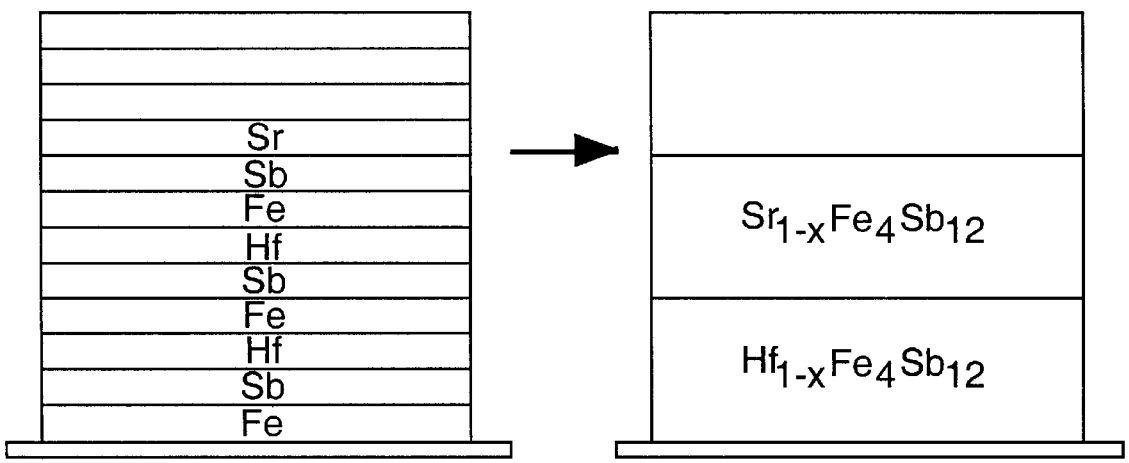
FIG. 17 shows a schematic of the initial structure of a repeat unit in an elementally modulated reactant designed to evolve into a crystalline superlattice structure of the present invention.

As in the synthesis of previous Examples, the superlattice compound illustrated in this Example was synthesized by layering the desired elements to yield an initially layered reactant (repeat unit) having a repeat thickness of about 20 Å and a composition near that of the desired $Sr_{1-x} Fe_4 Sb_{12}$ or $Hf_{1-x} Fe_4 Sb_{12}$ (see FIG. 17). Specifically, each of the elements of the $M_{1-x} M'_{4-y} Co_y M''_{12}$ component (i.e., first repeat unit or $Hf_{1-x}Fe_4Sb_{12}$ in this example) are layered and then, alternately, the elements for the $N_{1-x} N'_{4-y} N''_{12}$ component (i.e., second repeat unit or $Sr_{1-x}Fe_4Sb_{12}$ in this example) are layered to produce a superlattice-structured compound. Layer sequencing and thickness is dependent upon the desired superlattice structure. The lower nucleation temperatures for the thermodynamically metastable skutterudite crystalline-structured components of the superlattice, results in nucleation of the elements of each of the skutterudite crystalline-structured repeat units long before the alternating layers of the repeat units (i.e., $Hf_{1-x}Fe_4Sb_{12}$ and $Sr_{1-x}Fe_4Sb_{12}$ in this example) have sufficient time to intermix. The result is a superlattice structure having alternating layers of different skutterudite crystalline-structured compounds, as illustrated in FIG. 17.

The compounds of the present invention are promising thermoelectric materials because of their low thermal conductivity and good electrical properties. The low thermal conductivity may be due to the large thermal vibration amplitude of the relatively small cation which, as discussed above, is equivalent to having a soft phonon mode in the lattice. The electrical conductivity in these compounds occurs primarily in the antimony framework and is largely decoupled from the phonon mode. Accordingly, these compounds have enhanced electrical conductivity, allowing the Seebeck coefficient to be optimized. As a result, the skutterudite crystalline-structured compounds of the present invention have the highest Figure of Merit of any solid thermoelectric material that is synthesizable in reasonable quantities of reasonable purity.

Having illustrated and described the principles of the invention with several preferred embodiments and multiple various examples, it should be apparent to those skilled in the art that the invention can be modified in arrangement and detail without departing from such principles. We claim all the modifications coming within the spirit and scope of the following claims.

What is claimed is:

1. A thermodynamically metastable skutterudite crystalline-structured compound that satisfies the formula:

$$M_{1-x}M'_{4-y}Co_yM''_{12}$$

wherein:
x=0 to 1;
y=0 to 4;
M occupies crystalline-structure site 2(a) and M=any metal, metalloid, or mixture thereof, except La, Ce, Pr, Nd, and Eu when x=0 and M'=Fe, Ru, or Os and M''=Sb, P, or As;
M'=Fe, Ru, Os, Rh, or mixture thereof, except Ru, Bs or Rh when x=1 and y=0 and except Rh when x=and y<4, wherein M' is doped or undoped; and
M''=Sb, As, P, Bi, $Ge_{0.5-w}Se_{0.5+w}$, except P, As, or Sb when x=1 and y=4, wherein w=0 to 0.5, or mixture thereof, wherein M'' is doped or undoped.

2. The thermodynamically metastable skutterudite crystalline-structured compound of claim 1, wherein M is selected from the group consisting of rare-earth elements and mixtures thereof.

3. The thermodynamically metastable skutterudite crystalline-structured compound of claim 1, wherein M is a transition metal.

4. The thermodynamically metastable skutterudite crystalline-structured compound of claim 1, wherein M is selected from the group consisting of Group IIIb elements, Group IVb elements, and mixtures thereof.

5. The thermodynamically metastable skutterudite crystalline-structured compound of claim 1, wherein x>0.

6. The thermodynamically metastable skutterudite crystalline-structured compound of claim 5, wherein M' is iron.

7. The thermodynamically metastable skutterudite crystalline-structured compound of claim 6, wherein y=0.

8. The thermodynamically metastable skutterudite crystalline-structured compound of claim 5, wherein M'' is antimony.

9. The thermodynamically metastable skutterudite crystalline-structured compound of claim 5, wherein M'' is $Ge_{0.5-w}Se_{0.5+w}$, wherein w=0 to 0.5.

10. The thermodynamically metastable skutterudite crystalline-structured compound of claim 1, wherein x=0.

11. The thermodynamically metastable skutterudite crystalline-structured compound of claim 1, wherein the compound nucleates from an amorphous mixture at a temperature of less than about 500° C.

12. The thermodynamically metastable skutterudite crystalline-structured compound of claim 1, wherein the compound nucleates from an amorphous mixture at a temperature of less than about 300° C.

13. The thermodynamically metastable skutterudite crystalline-structured compound of claim 1, wherein M' is iron.

14. The thermodynamically metastable skutterudite crystalline-structured compound of claim 9, wherein y=0.

15. The thermodynamically metastable skutterudite crystalline-structured compound of claim 1, wherein M'' is antimony.

16. The thermodynamically metastable skutterudite crystalline-structured compound of claim 1, wherein M'' is $Ge_{0.5-w}Se_{0.5+w}$, wherein w=0 to 0.5.

17. The thermodynamically metastable skutterudite crystalline-structured compound of claim 1, wherein the compound decomposes into thermodynamically stable binary compounds and elemental components at temperatures greater than about 550° C.

18. The thermodynamically metastable skutterudite crystalline-structured compound of claim 1, wherein x=1.

19. A thermodynamically metastable compound that satisfies the formula $$M_{1-x}M'_{4-y}Co_yM''_{12}$$

wherein:
x=0 to 1;
y=0 to 4;
M occupies the crystal unit cell site 2(a) and M=any metal, metalloid, or mixture thereof, except La, Ce, Pr, Nd, and Eu when x=0, and M'=Fe, Ru, or Os, and M''=Sb, P, or As;
M'=Fe, Ru, Os, Rh, or mixture thereof, except Ru, Os or Rh when x=1 and y=0, wherein M' is doped or undoped;
M''=Sb, As, P, Bi, $Ge_{0.5-w}Se_{0.5+w}$, except P, As, or Sb when x=1 and y=4, and except Sb when x=32 1 and y<4, wherein w=0 to 0.5, or mixture thereof, wherein M'' is doped or undoped; and
the compound having a thermoelectric Figure of Merit greater than or equal to 1.

20. The compound of claim 19, wherein x>0.

21. The compound of claim 20, wherein M is a rare-earth element.

22. The compound of claim 20, wherein M' is iron and M'' is antimony.

23. The compound of claim 19, wherein M is a rare-earth element.

24. The compound of claim 19, wherein M' is iron and M'' is antimony.

25. The compound of claim 19, wherein x=0.

26. A thermodynamically metastable superlattice skutterudite crystalline-structured compound that satisfies the formula:

$(M_{1-x}M'_{4-y}Co_yM''_{12})_m(N_{1-x'}N'_{4-y'}Co_yN''_{12})_n$ wherein:
x=0 to 1;
y=0 to 4;
M occupies skutterudite crystalline-structure site 2(a) and M=any metal, metalloid, or mixture thereof,
M'=Fe, Ru, Os, Rh, or mixture thereof, except Ru, Os or Rh when x=1 and y=0, wherein M' is doped or undoped;
M''=Sb, As, P, Bi, $Ge_{0.5-w}Se_{0.5+w}$ except P, As, or Sb when x=1 and y=4, wherein w=0 to 0.5, or mixture thereof, wherein M'' is doped or undoped;
N=any metal, metalloid, or mixture thereof;
N'=Fe, Ru, Os, Rh, or mixture thereof, wherein N' is doped or undoped;
N''=Sb, As, P, Bi, $Ge_{0.5-w}Se_{0.5+w}$ wherein w=0 to 0.5, or mixture thereof, wherein N'' is doped or undoped;
x'=0 to 1;
y'=0 to 4; and
m and n are each greater than 0.

27. The thermodynamically metastable superlattice skutterudite crystalline-structured compound of claim 26, wherein x>0.

28. The thermodynamically metastable superlattice skutterudite crystalline-structured compound of claim 26, wherein the compound has a ZT value of greater than 1.

29. The thermodynamically metastable superlattice skutterudite crystalline-structured compound of claim 26, wherein x=0.

30. The thermodynamically metastable superlattice skutterudite crystalline-structured compound of claim 26, wherein x>0 and x'>0.

31. A superlattice thermodynamically metastable skutterudite crystalline-structured compounds that satisfies the formula:

$(M_{1-x}M'_{4-y}Co_yM''_{12})_m(N_aN'_bN''_c)_n$ wherein:
x=0 to 1;
y=0 to 4;
M occupies crystal unit cell site 2(a) and M=any metal, metalloid, or mixture thereof;
M'=Fe, Ru, Os, Rh, or mixture thereof, except Ru, Os, or Rh when x=1 and y=0, wherein M' is doped or undoped;
M''=Sb, As, P, Bi, $Ge_{0.5-w}Se_{0.5+w}$, except Sb, As, or P when x=1 and y=4, wherein w=0 to 0.5, or mixture thereof, wherein M'' is doped or undoped;
N=Ga, Al, Zn, Cd, Cu, or mixture thereof;
N'=Si, Ge, Sn, In, or mixture thereof;
N''=As, S, P, Se, N, C, or mixture thereof;
a=1 or 2;
b=0 or 1;
c=1, 2, or 3; and
n and m each represent a quantity greater than 0.

32. The superlattice compound of claim 31, wherein x>0.

33. The superlattice compound of claim 31, wherein the compound has a ZT value greater than 1.

34. The superlattice compound of claim 31, wherein x=0.

35. A superlattice, thermodynamically metastable, skutterudite crystalline-structured compound that satisfies the formula:

$(M_{1-x}M'_{4-y}Co_yM''_{12})_m(N)_n$ wherein:
x=0 to 1;
y=0 to 4;
M occupies crystal unit cell site 2(a) and M=any metal, metalloid, or mixture thereof;
M'=Fe, Ru, Os, Rh, or mixture thereof, except Ru, Os, or Rh when x=1 and y=0, wherein M' is doped or undoped;
M''=Sb, As, P, Bi, $Ge_{0.5-w}Se_{0.5+w}$, except Sb, As, or P when x=1 and y=4, wherein w=0 to 0.5, or mixture thereof, wherein M'' is doped or undoped;
N=a ternary sulfide with a chalcopyrite structure, a ternary selenide with a chalcopyrite structure, and mixtures thereof; and
n and m each represent a quantity greater than 0.

* * * * *

UNITED STATES PATENT AND TRADEMARK OFFICE
CERTIFICATE OF CORRECTION

PATENT NO.   : 5,994,639
DATED        : November 30, 1999
INVENTOR(S)  : Johnson et al.

It is certified that error appears in the above-identified patent and that said Letters Patent is hereby corrected as shown below:

Column 9,
Line 65, "skutterudite 492" should be -- skutterudite --.

Column 10,
Line 40, "$Hl_{1-x}$" should be -- $Hf_{1-x}$ --.

Column 12,
Line 14, a period -- . -- should be added after "crystallized".
Line 22, a period -- . -- should be added after "nucleation".

Column 13,
Line 38, "od" should be -- of --, and an end parenthesis -- ) -- should be added after "Co.".

Column 14,
Line 28, "$LaFe_4Sb_2$" should be -- $LaFe_4Sb_{12}$ --.

Column 19, claim 1,
Line 44, "Bs" should be -- Os --.
Lines 45-46, "except Rh when x = and y < 4, ," should be -- except Rh when x = 1 and y < 4, --.

Column 20, claim 19,
Line 43, the comma "," after "x = 0" should be deleted, and the comma "," after "Os" should be deleted.
Line 50, "x = 32 1" should be -- x = 1 --.

UNITED STATES PATENT AND TRADEMARK OFFICE
CERTIFICATE OF CORRECTION

PATENT NO. : 5,994,639
DATED : November 30, 1999
INVENTOR(S) : Johnson et al.

It is certified that error appears in the above-identified patent and that said Letters Patent is hereby corrected as shown below:

Column 21, claim 26,
Line 21, "x' = 0to 1;" should be -- x' = 0 to 1; --.

Column 22, claim 31,
Line 14, "b = 0or 1;" should be -- b = 0 or 1; --.

Signed and Sealed this

Twelfth Day of February, 2002

Attest:

JAMES E. ROGAN
*Director of the United States Patent and Trademark Office*

*Attesting Officer*